US012563756B2

(12) United States Patent
Kung et al.

(10) Patent No.: US 12,563,756 B2
(45) Date of Patent: Feb. 24, 2026

(54) MEMORY DEVICE HAVING A CONTAINER-SHAPED ELECTRODE

(71) Applicant: NANYA TECHNOLOGY CORPORATION, New Taipei (TW)

(72) Inventors: Yao-Hsiung Kung, Taoyuan (TW); Chao-Wen Lay, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 411 days.

(21) Appl. No.: 18/126,573

(22) Filed: Mar. 27, 2023

(65) Prior Publication Data

US 2024/0332348 A1 Oct. 3, 2024

(51) Int. Cl.
*H10D 1/68* (2025.01)

(52) U.S. Cl.
CPC ............. *H10D 1/716* (2025.01); *H10D 1/696* (2025.01)

(58) Field of Classification Search
CPC ........ H10D 1/696; H10D 1/716; H10B 12/02; H10B 12/03
See application file for complete search history.

(56) References Cited

U.S. PATENT DOCUMENTS

| | | | |
|---|---|---|---|
| 2016/0064386 A1 | 3/2016 | Park et al. | |
| 2021/0066066 A1 | 3/2021 | Lee et al. | |
| 2021/0257371 A1 | 8/2021 | Son et al. | |
| 2023/0019688 A1* | 1/2023 | Kao | H10D 1/716 |

FOREIGN PATENT DOCUMENTS

| | | |
|---|---|---|
| TW | 202230575 A | 8/2022 |
| TW | 202310354 A | 3/2023 |

OTHER PUBLICATIONS

Office Action and search report mailed on Jun. 21, 2024 related to Taiwanese Application No. 113112272.
Office Action and Search Report dated on Mar. 12, 2024 related to Taiwanese Application No. 112127796.
Baldi, L., & Beardo, D. (1985). Effects of doping on polysilicon etch rate in a fluorine-containing plasma. Journal of Applied Physics, 57(6), 2221-2225. https://doi.org/10.1063/1.334366.

* cited by examiner

*Primary Examiner* — Thanhha S Pham
(74) *Attorney, Agent, or Firm* — Xuan Zhang

(57) ABSTRACT

The present disclosure provides a memory device and a manufacturing method of the memory device. The memory device includes: a substrate, a landing area over the substrate, a bottom electrode over the landing area, and a high-k layer over the bottom electrode, wherein the bottom electrode includes a lower portion over the landing area, a middle portion over the lower portion, and an upper portion over the middle portion, and the bottom electrode has a container-shaped profile.

12 Claims, 22 Drawing Sheets

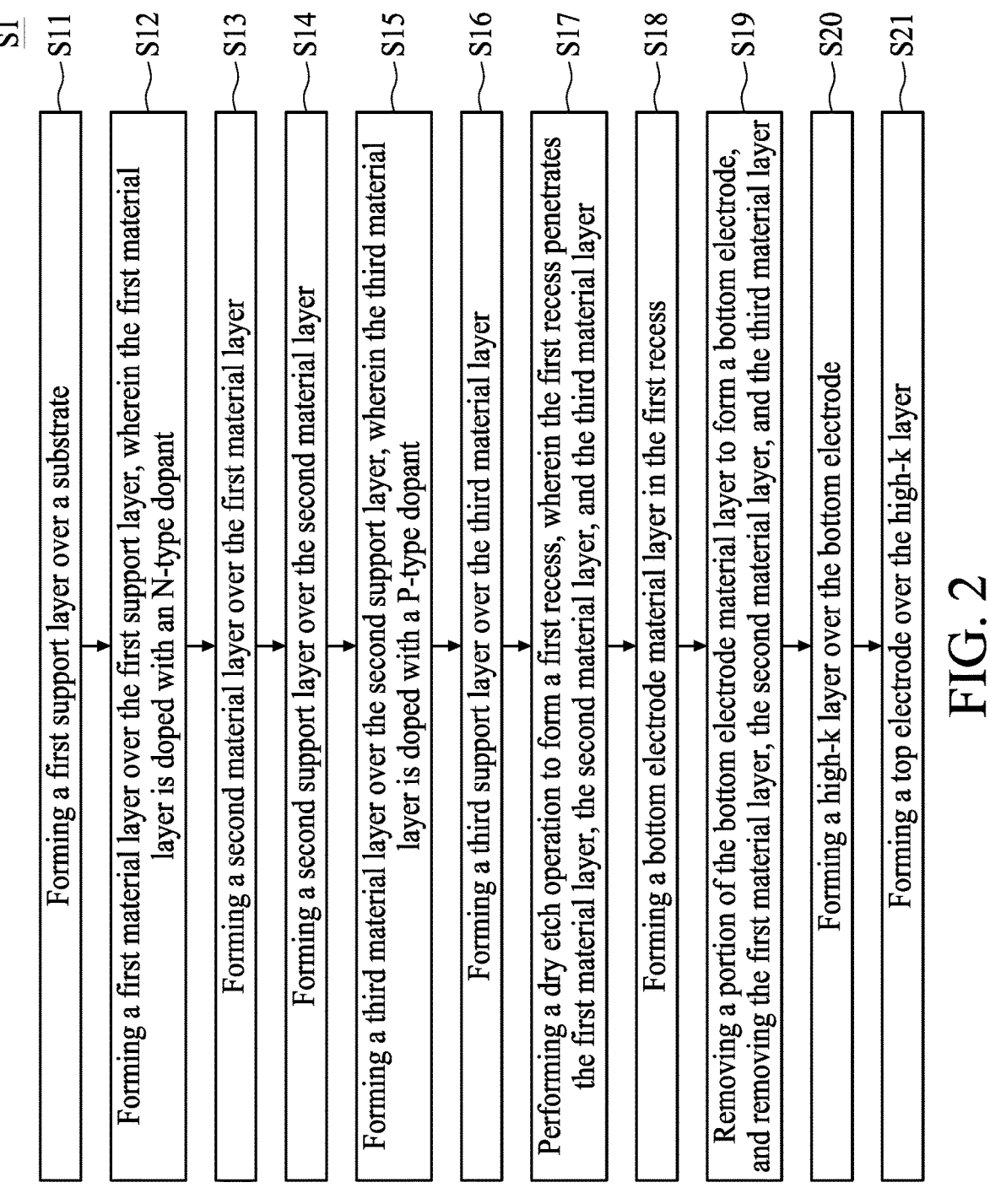

S1

S11 — Forming a first support layer over a substrate

S12 — Forming a first material layer over the first support layer, wherein the first material layer is doped with an N-type dopant S13 — Forming a second material layer over the first material layer S14 — Forming a second support layer over the second material layer S15 — Forming a third material layer over the second support layer, wherein the third material layer is doped with a P-type dopant S16 — Forming a third support layer over the third material layer S17 — Performing a dry etch operation to form a first recess, wherein the first recess penetrates the first material layer, the second material layer, and the third material layer S18 — Forming a bottom electrode material layer in the first recess S19 — Removing a portion of the bottom electrode material layer to form a bottom electrode, and removing the first material layer, the second material layer, and the third material layer S20 — Forming a high-k layer over the bottom electrode S21 — Forming a top electrode over the high-k layer

FIG. 2

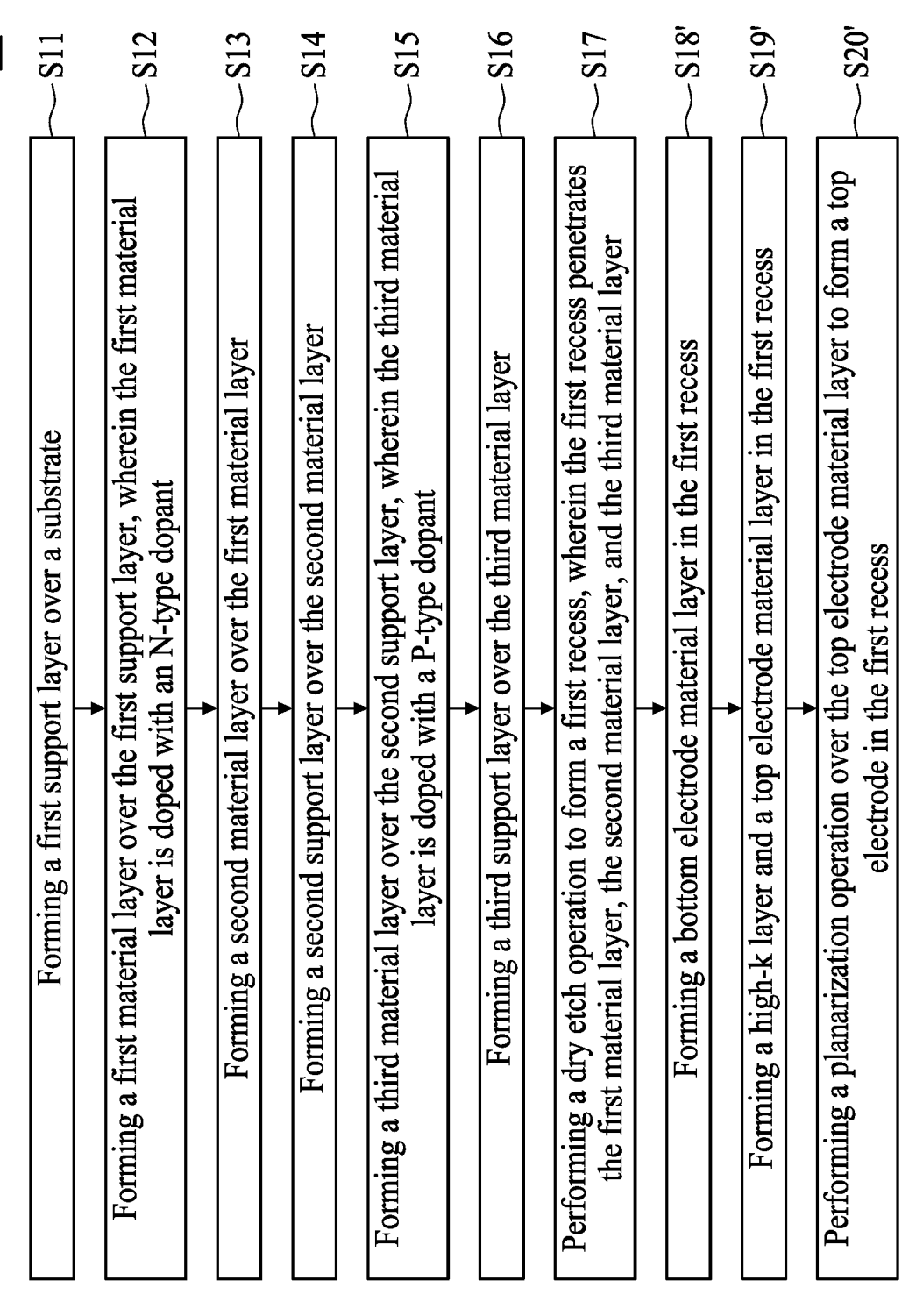

S2

S11 — Forming a first support layer over a substrate

S12 — Forming a first material layer over the first support layer, wherein the first material layer is doped with an N-type dopant S13 — Forming a second material layer over the first material layer S14 — Forming a second support layer over the second material layer S15 — Forming a third material layer over the second support layer, wherein the third material layer is doped with a P-type dopant S16 — Forming a third support layer over the third material layer S17 — Performing a dry etch operation to form a first recess, wherein the first recess penetrates the first material layer, the second material layer, and the third material layer S18' — Forming a bottom electrode material layer in the first recess S19' — Forming a high-k layer and a top electrode material layer in the first recess S20' — Performing a planarization operation over the top electrode material layer to form a top electrode in the first recess

FIG. 17

MEMORY DEVICE HAVING A CONTAINER-SHAPED ELECTRODE

TECHNICAL FIELD

The present disclosure relates to a memory device and a method for fabricating the memory device, and more particularly, to a memory device having a bottom electrode with a container profile and a method for fabricating the memory device having the bottom electrode with the container profile.

DISCUSSION OF THE BACKGROUND

Continuous advancements in technology have allowed capacitors to have increasingly high aspect ratios in fabrication of integrated circuits. A storage electrode of a memory device is shaped as a container. The advancements in technology are resulting in increasing heights of container-shaped storage nodes.

However, conventional etching techniques (particularly techniques for high-aspect-ratio etching) limit performance of memory devices. Specifically, a recess formed by the conventional etching techniques has a smaller dimension at a bottom, reducing a capacitance of a capacitor formed in the recess. In addition, some types of conventional wet etch techniques may cause significant material loss and device defects due to poor control.

This Discussion of the Background section is provided for background information only. The statements in this Discussion of the Background are not an admission that the subject matter disclosed in this Discussion of the Background section constitute prior art to the present disclosure, and no part of this Discussion of the Background section may be used as an admission that any part of this application, including this Discussion of the Background section, constitutes prior art to the present disclosure.

SUMMARY

One aspect of the present disclosure provides a memory device including: a substrate, a landing area over the substrate, a bottom electrode over the landing area, and a high-k layer over the bottom electrode, wherein the bottom electrode includes a lower portion over the landing area, wherein the lower portion has a first width measured from a first inner sidewall of the lower portion to a second inner sidewall of the lower portion, a middle portion over the lower portion, wherein the middle portion has a second width measured from a third inner sidewall of the middle portion to a fourth inner sidewall of the middle portion, and an upper portion over the middle portion, wherein the upper portion has a third width measured from a fifth inner sidewall of the upper portion to a sixth inner sidewall of the upper portion, wherein the third width is greater than the first width.

Another aspect of the present disclosure provides a memory device including: a substrate; a landing area over the substrate; a bottom electrode over the landing area, wherein the bottom electrode has a container-shaped profile, and the bottom electrode includes a lower portion over the landing area and an upper portion over the lower portion; a high-k layer over the bottom electrode; a first support layer over the substrate; and a second support layer over the first support layer, wherein the second support layer is separated from the first support layer.

Another aspect of the present disclosure provides a method for fabricating a memory device, including: forming a first support layer over a substrate; forming a first material layer over the first support layer, wherein the first material layer is doped with an N-type dopant; forming a second material layer over the first material layer; forming a second support layer over the second material layer; forming a third material layer over the second support layer, wherein the third material layer is doped with a P-type dopant; performing a dry etch operation to form a first recess, wherein the first recess penetrates the first material layer, the second material layer, and the third material layer; and forming a bottom electrode in the first recess.

In order to meet cell capacitance requirements for advanced memory devices, such as dynamic random-access memory (DRAM) devices, greater capacitance is required. Accordingly, there is a need to develop new memory device designs, and methods for forming the same. Therefore, the present disclosure provides a configuration of material layers, wherein the material layers are adapted to support a bottom electrode, and a recess formed in the material layers can have a greater dimension at a bottom, which may lead to better device performance. Further, etching techniques provided by the present disclosure are compatible with existing memory device fabrication operations.

A design of the memory device discussed in the present disclosure, and a fabrication method thereof, aim to address the aforesaid issues. Particularly, the present disclosure provides a memory device having a container-shaped electrode and a method of forming the memory device having the container-shaped electrode.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

FIG. 2 is a flow diagram illustrating a method of manufacturing a memory device in accordance with some embodiments of the present disclosure.

FIG. 10' is a top view perspective schematic diagram of an intermediate stage in the formation of the memory device shown in FIG. 10 in accordance with some embodiments of the present disclosure.

FIG. 12' is a top view perspective schematic diagram of an intermediate stage in the formation of a memory device shown in FIG. 12 in accordance with some embodiments of the present disclosure.

FIG. 17 is a flow diagram illustrating a method of manufacturing a memory device in accordance with some embodiments of the present disclosure.

DETAILED DESCRIPTION

Figure 1:
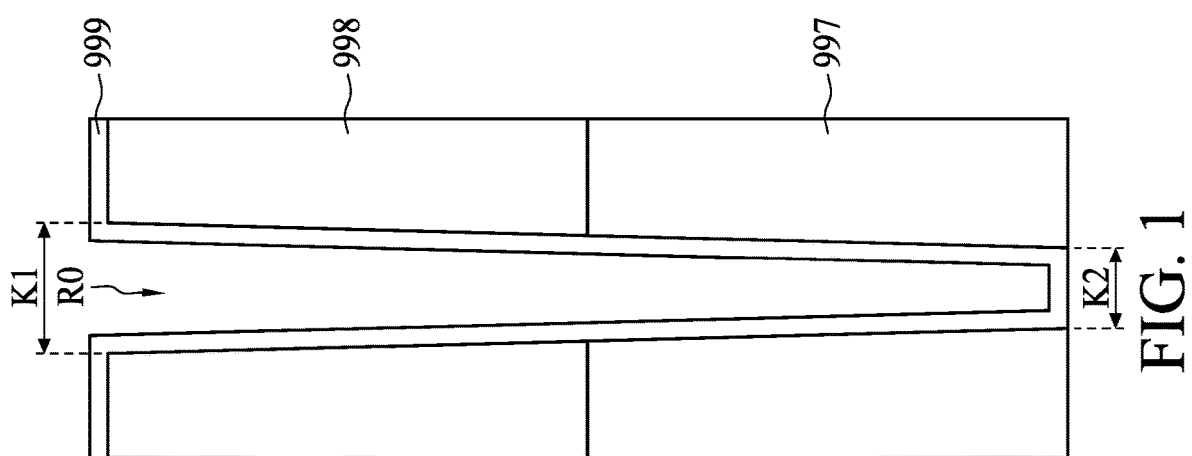
FIG. 1 is a cross-sectional view of a semiconductor device in accordance with a comparative embodiment.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It shall be understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

The formation of an electrode of a memory device requires performing an etching operation on an insulation stack. However, a recess formed by conventional etching techniques has a smaller dimension at a bottom. As a result, an electrode formed in such recess may have an undesired profile.

FIG. 1 is a cross-sectional view of a semiconductor device in accordance with a comparative embodiment. For example, as shown in FIG. 1, a recess R0 is formed in an insulation stack, wherein the insulation stack includes a borophosphosilicate glass (BPSG) layer 997 and an oxide layer 998 over the BPSG layer 997. An electrode 999 is formed in the recess R0. However, a dimension K1 at a top of the recess R0 is substantially greater than a dimension K2 at a bottom of the recess R0. For example, the dimension K1 may be greater than the dimension K2 by 10 nm to 15 nm.

Smaller values of the dimension K2 lead to lower capacitance of a capacitor further formed in the recess R0. Alternatively stated, a capacitance of a capacitor structure formed in the recess R0 may be severely limited due to a limitation of the dimension K2 at the bottom of the recess R0.

In addition, conventional wet etch techniques may cause significant material loss due to poor etch rate control. Alternatively stated, it is difficult to control a profile of the recess R0; for example, a bowing issue may occur at a position proximal to the top of the recess R0. Such issues may lead to poor device performance, or even cause electrical shorting between electrodes.

In order to meet cell capacitance requirements for advanced memory devices, such as dynamic random-access memory (DRAM) devices, a method for increasing capacitance is required. Accordingly, there is a need to develop a new memory device and a new method for forming the same. A first embodiment is depicted in FIGS. 2 to 16, and a second embodiment is depicted in FIGS. 17 to 20, wherein the second embodiment may further include operations depicted in FIGS. 3 to 10 that can be performed prior to the operations depicted in FIGS. 18 to 20.

FIG. 2 is a flow diagram illustrating a method S1 of manufacturing a memory device in accordance with some embodiments of the present disclosure. The method S1 includes a number of operations (S11, S12, S13, S14, S15, S16, S17, S18, S19, S20 and S21) and the description and illustration are not deemed as a limitation to the sequence of the operations. In the operation S11, a first support layer is formed over a substrate. In the operation S12, a first material layer is formed over the first support layer, wherein the first material layer is doped with an N-type dopant. In the operation S13, a second material layer is formed over the first material layer. In the operation S14, a second support layer is formed over the second material layer. In the operation S15, a third material layer is formed over the second support layer, wherein the third material layer is doped with a P-type dopant. In the operation S16, a third support layer is formed over the third material layer. In the operation S17, a dry etch operation is performed to form a first recess, wherein the first recess penetrates the first material layer, the second material layer, and the third material layer. In the operation S18, a bottom electrode material layer is formed in the first recess. In the operation S19, a portion of the bottom electrode material layer is removed to form a bottom electrode, and the first material layer, the second material layer and the third material layer are removed. In the operation S20, a high-k layer is formed over the bottom electrode. In the operation S21, a top electrode is formed over the high-k layer.

FIGS. 3 to 16 are schematic diagrams illustrating various fabrication stages constructed according to the method S1 in accordance with some embodiments of the present disclosure.

Figure 3:
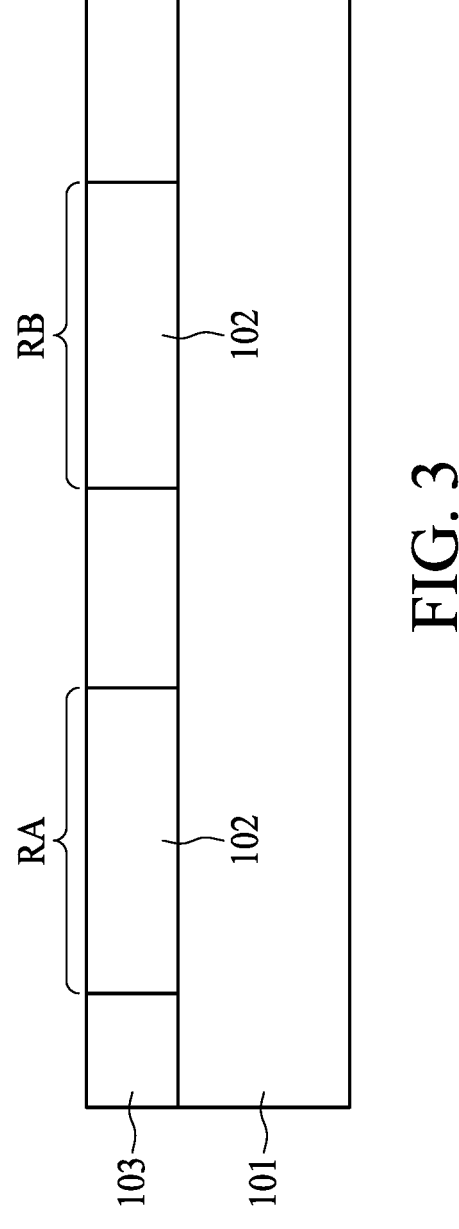
FIGS. 3 to 10 are cross-sectional diagrams of intermediate stages in the formation of a memory device in accordance with some embodiments of the present disclosure.

FIG. 3 is a cross-sectional diagram of an intermediate stage in the formation of a memory device in accordance with some embodiments of the present disclosure. Prior to the operation S11, a substrate 101 is received. An insulation layer 103 is formed over the substrate 101, and a plurality of landing areas 102 are formed in the insulation layer 103. For example, a landing area 102 is formed over a first region RA of the substrate 101, and another landing area 102 is formed over a second region RB that is different from the first region RA. In some embodiments, a chemical mechanical planarization (CMP) operation can be performed from above the insulation layer 103 and the landing areas 102. In some embodiments, the landing areas 102 include conductive material.

The substrate 101 may be a semiconductor substrate, such as a bulk semiconductor, a semiconductor-on-insulator (SOI) substrate, or the like. The substrate 101 can include an elementary semiconductor including silicon or germanium in a single crystal form, a polycrystalline form, or an amorphous form; a compound semiconductor material including at least one of silicon carbide, gallium arsenide, gallium phosphide, indium phosphide, indium arsenide, and indium antimonide; an alloy semiconductor material including at least one of silicon, SiGe, GaAsP, AlInAs, AlGaAs, GaInAs, GaInP, and GaInAsP; any other suitable materials; or a combination thereof. In some embodiments, the alloy semiconductor substrate may be a silicon alloy with a gradient silicon feature in which Si and metal compositions change from one ratio at one location to another ratio at another location of the gradient silicon feature. For example, the alloy semiconductor substrate may be a SiGe alloy with a gradient SiGe feature in which Si and Ge compositions change from one ratio at one location to another ratio at another location of the gradient SiGe feature. In another embodiment, the SiGe alloy is formed over a silicon substrate. In some embodiments, a SiGe alloy can be mechanically strained by another material in contact with the SiGe alloy.

In some embodiments, the substrate 101 may have a multilayer structure, or the substrate 101 may include a multilayer compound semiconductor structure. In some embodiments, the substrate 101 includes semiconductor devices, electrical components, electrical elements or a combination thereof. In some embodiments, the substrate 101 includes transistors or functional units of transistors.

Figure 4:
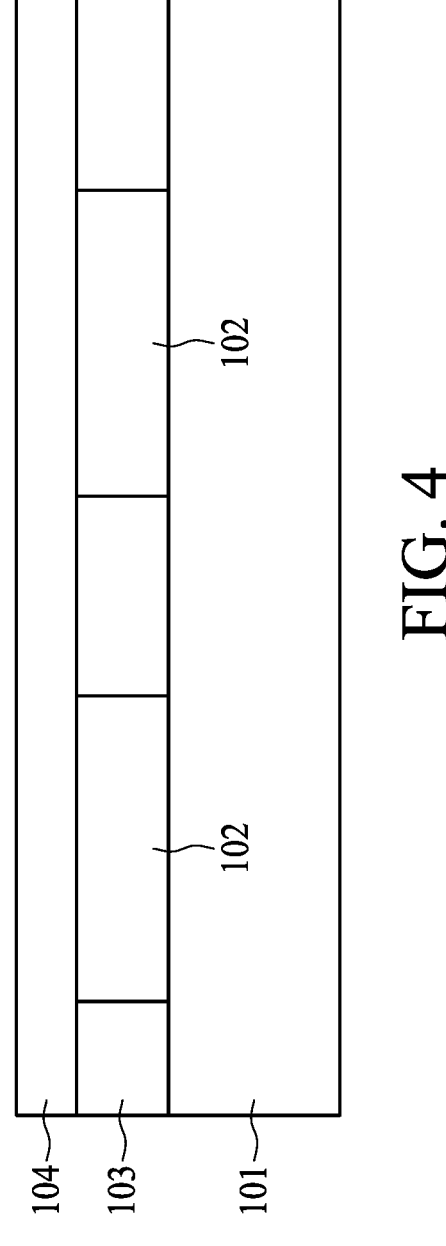

FIG. 4 is a cross-sectional diagram of an intermediate stage in the formation of a memory device in accordance with some embodiments of the present disclosure. In the operation S11, a first support layer 104 is formed over the substrate 101. The first support layer 104 extends over the insulation layer 103 and the landing areas 102. In some embodiments, a material of the first support layer 104 includes silicon nitride (SiN). Alternatively, a material of the first support layer 104 can be another suitable material, such as an insulation material.

Figure 5:
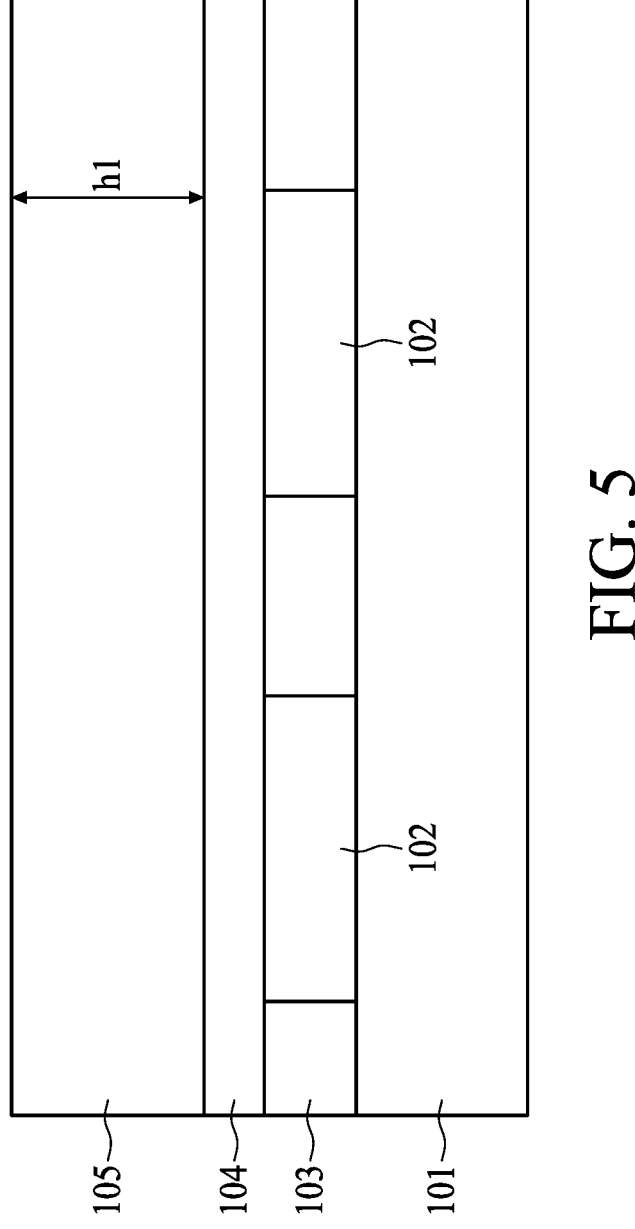

FIG. 5 is a cross-sectional diagram of an intermediate stage in the formation of a memory device in accordance with some embodiments of the present disclosure. In the operation S12, a first material layer 105 is formed over the first support layer 104, wherein the first material layer 105 is doped with an N-type dopant. For example, the first material layer 105 can be doped with phosphorus, arsenic, antimony, bismuth, or other suitable dopants. In some embodiments, the first material layer 105 includes polysilicon doped with an N-type dopant. The first material layer 105 has a first thickness h1. In some embodiments, the first thickness h1 of the first material layer 105 is less than 400 nm. In some embodiments, when the first material layer 105 is doped with phosphorus, a concentration of phosphorus dopant in the first material layer 105 is in a range from 5E14 atoms/cm$^3$ to about 5E15 atoms/cm$^3$.

Figure 6:
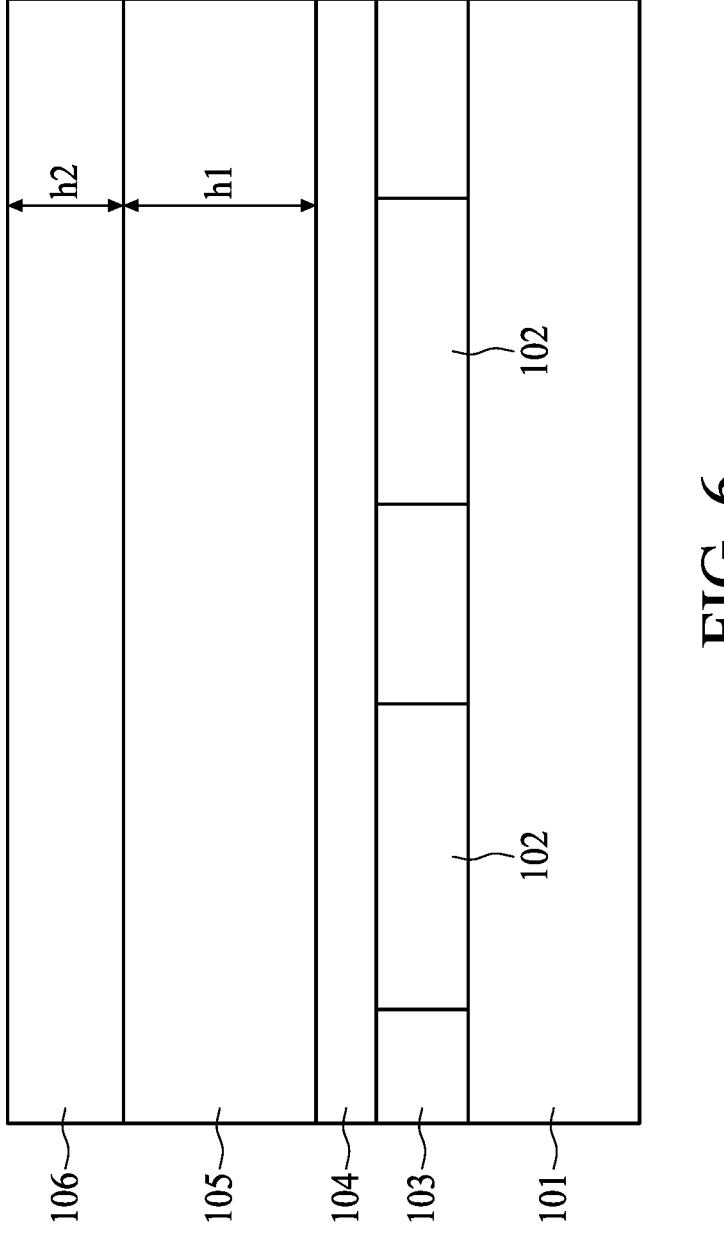

FIG. 6 is a cross-sectional diagram of an intermediate stage in the formation of a memory device in accordance with some embodiments of the present disclosure. In the operation S13, a second material layer 106 is formed over the first material layer 105. The second material layer 106 has a second thickness h2. In some embodiments, the second thickness h2 of the second material layer 106 is less than the first thickness h1 of the first material layer 105. In some embodiments, the second thickness h2 of the second material layer 106 is less than 200 nm. In some embodiments, the second material layer 106 includes undoped polysilicon (which can be referred to as intrinsic polysilicon), that is, without significant dopant therein. The second material layer 106 may be in direct contact with the first material layer 105.

Figure 7:
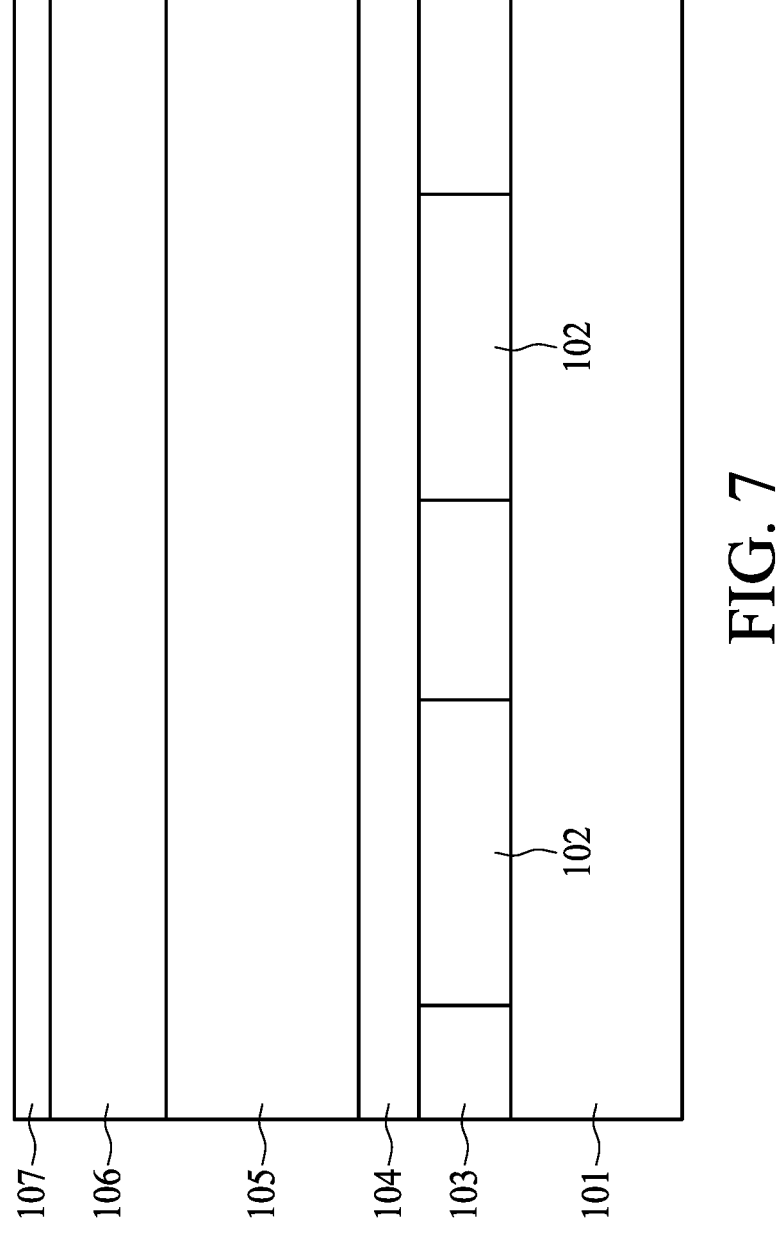

FIG. 7 is a cross-sectional diagram of an intermediate stage in the formation of a memory device in accordance with some embodiments of the present disclosure. In the operation S14, a second support layer 107 is formed over the second material layer 106. A material of the second support layer 107 may be identical to the material of the first support layer 104. In some embodiments, a material of the second support layer 107 includes silicon nitride (SiN).

Figure 8:
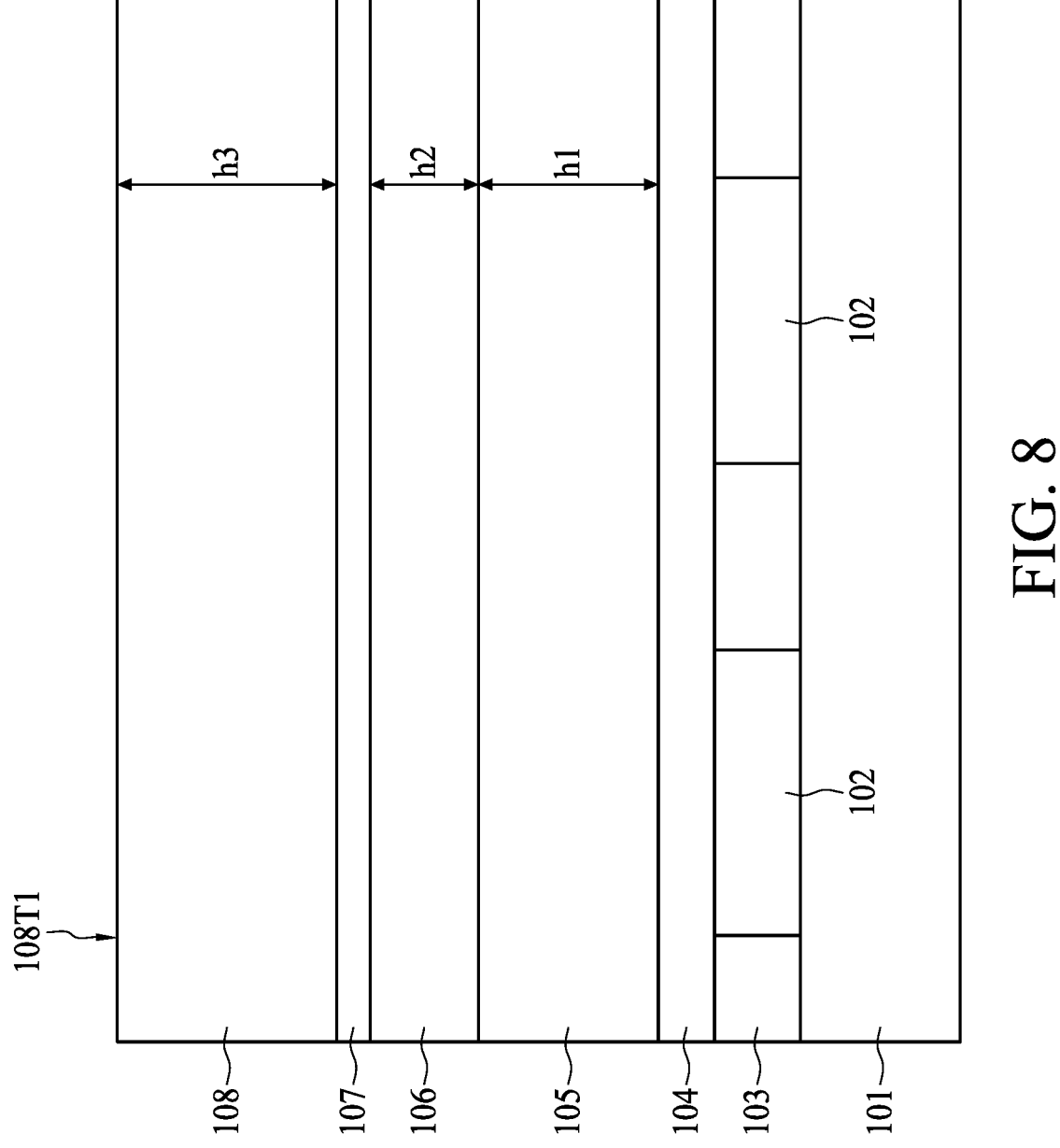

FIG. 8 is a cross-sectional diagram of an intermediate stage in the formation of a memory device in accordance with some embodiments of the present disclosure. In the operation S15, a third material layer 108 is formed over the second support layer 107, wherein the third material layer 108 is doped with a P-type dopant. For example, the third material layer 108 can be doped with boron, indium, gallium, or other suitable dopants. The third material layer 108 has a third thickness h3. In some embodiments, the third thickness h3 of the third material layer 108 is greater than the first thickness h1 of the first material layer 105. In some embodiments, the third thickness h3 of the third material layer 108 is greater than the second thickness h2 of the second material layer 106. In some embodiments, the third thickness h3 of the third material layer 108 is less than 500 nm. In some embodiments, a sum of the first thickness h1 of the first material layer 105 and the second thickness h2 of the second material layer 106 is greater than the third thickness h3 of the third material layer 108.

In some embodiments, the third material layer 108 includes polysilicon doped with a P-type dopant. In some embodiments, when the third material layer 108 is doped with boron, a concentration of boron dopant in the third material layer 108 is in a range from 5E14 atoms/cm$^3$ to about 5E15 atoms/cm$^3$. The third material layer 108 may be in direct contact with the second support layer 107. The third material layer 108 has a top surface 108T1.

Figure 9:
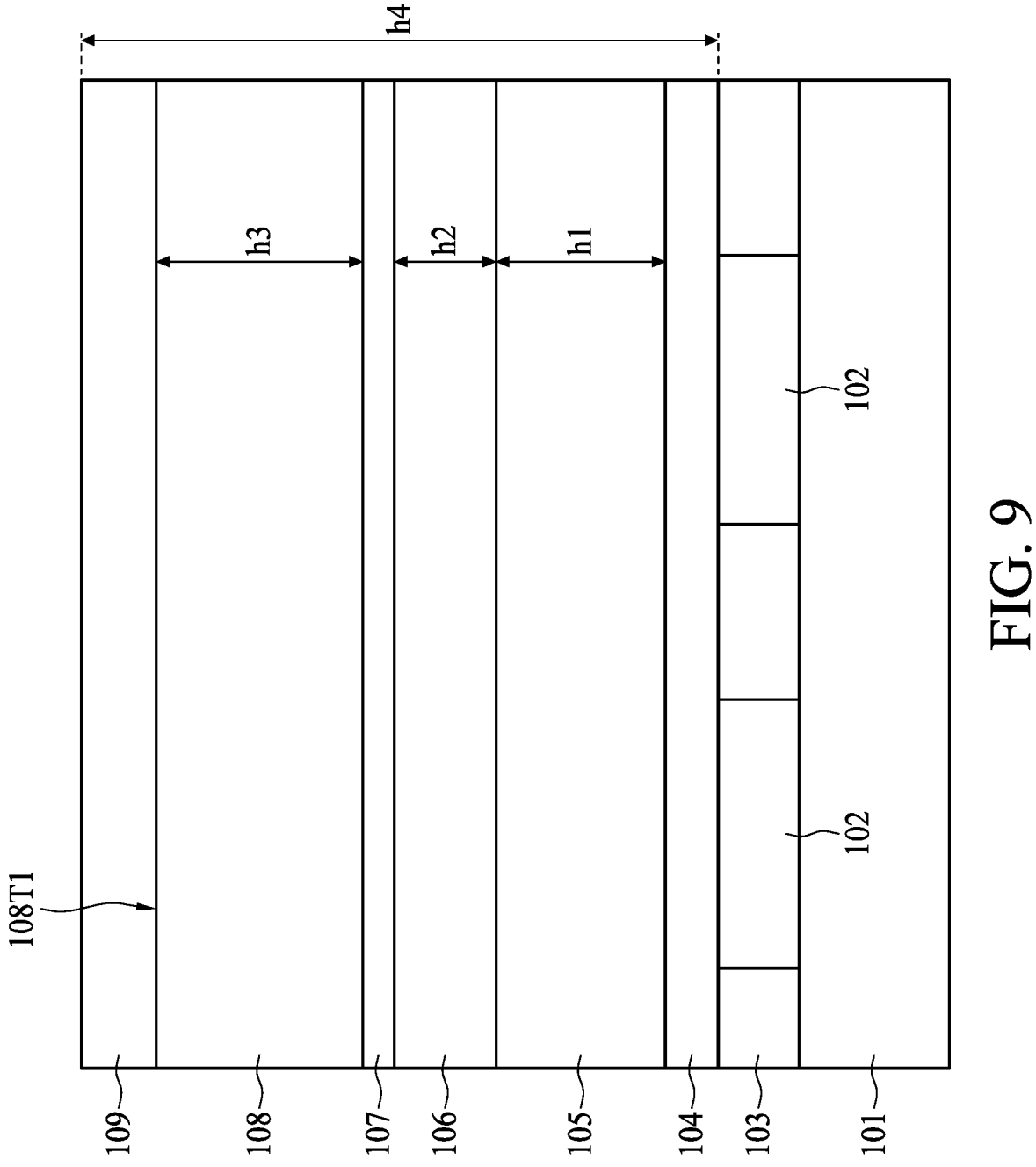

FIG. 9 is a cross-sectional diagram of an intermediate stage in the formation of a memory device in accordance with some embodiments of the present disclosure. In the operation S16, a third support layer 109 is formed over the top surface 108T1 of the third material layer 108. A material of the third support layer 109 may be identical to the material of the first support layer 104 or the material of the second support layer 107. In some embodiments, a material of the third support layer 109 includes silicon nitride (SiN). In some embodiments, a total thickness h4 of a stack of the first support layer 104, the first material layer 105, the second material layer 106, the second support layer 107, the third material layer 108, and the third support layer 109 may be in a range from 0.8 μm to about 1.2 μm.

Figure 10:
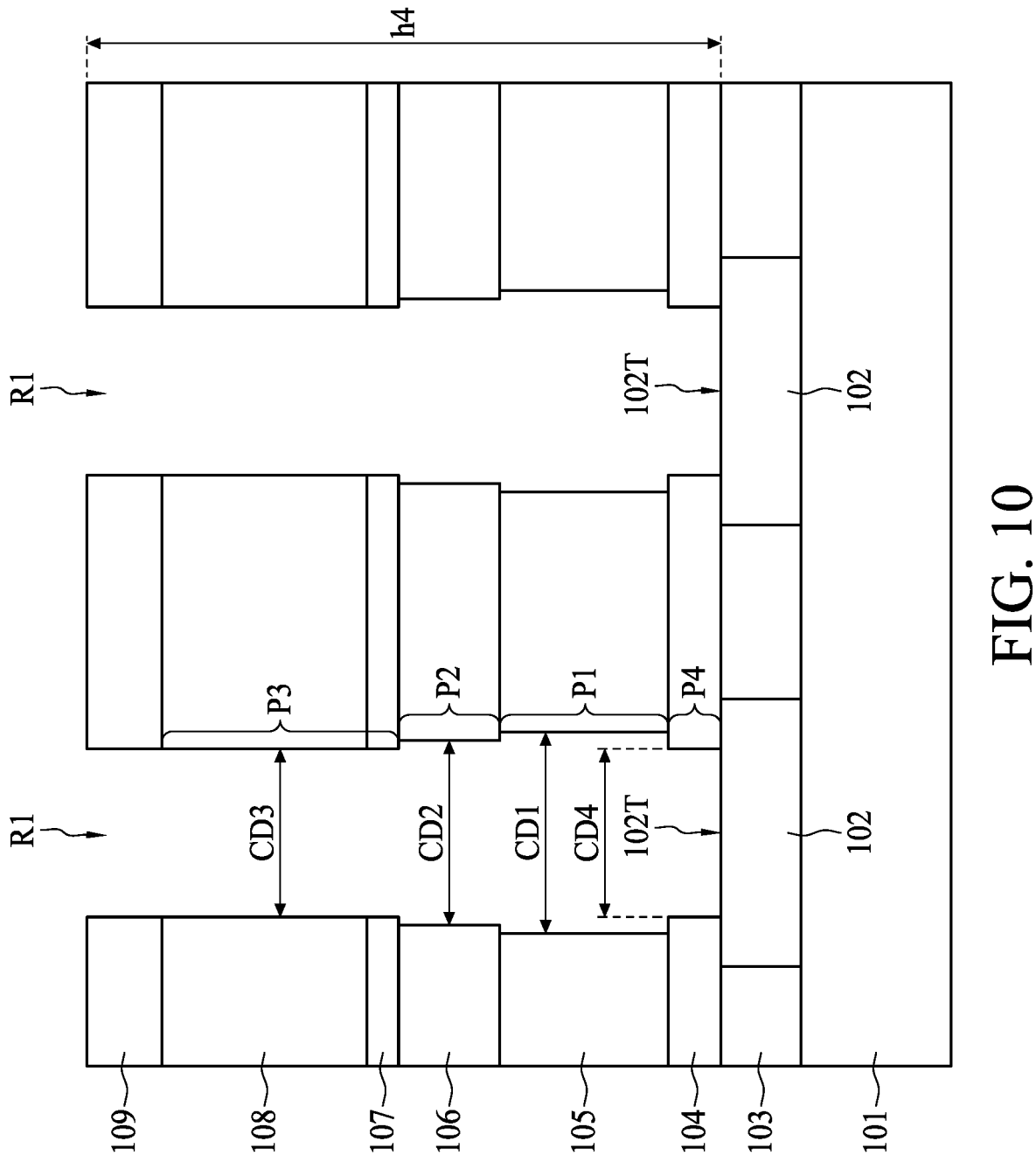
Figure 10:
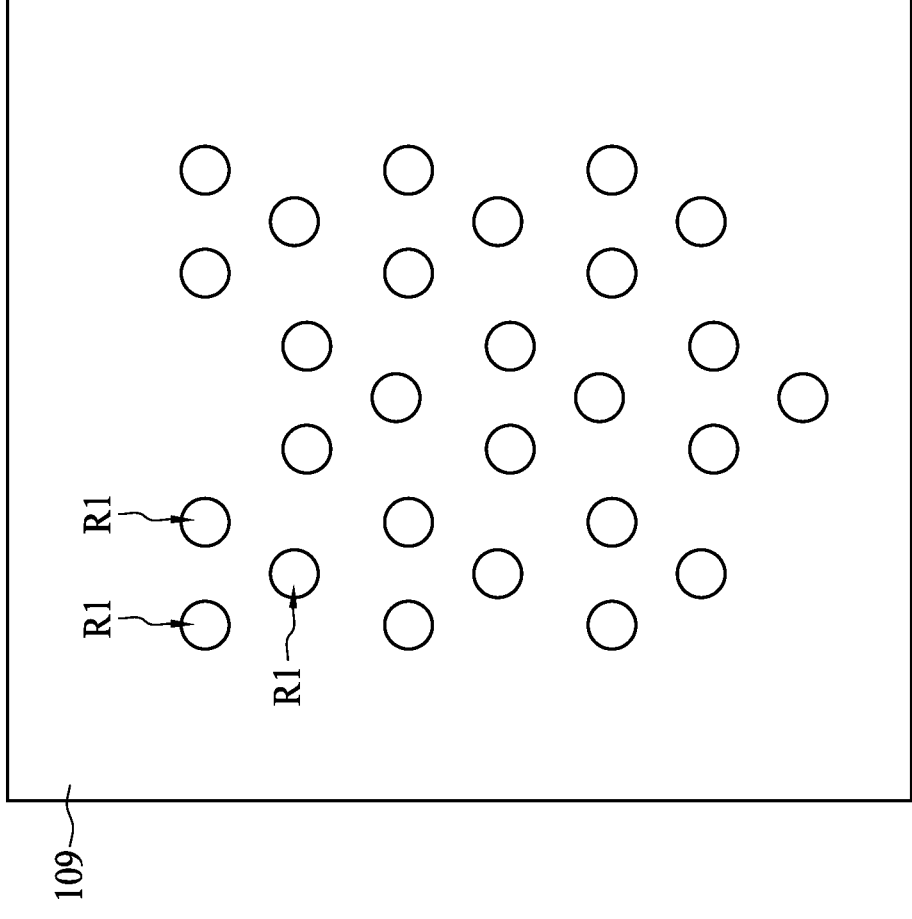

FIG. 10 is a cross-sectional diagram of an intermediate stage in the formation of a memory device in accordance with some embodiments of the present disclosure, and FIG. 10' is a top view perspective schematic diagram of an intermediate stage in the formation of a memory device shown in FIG. 10 in accordance with some embodiments of the present disclosure. In the operation S17, a plurality of first recesses R1 are formed over the substrate 101 by performing a dry etch operation. In some embodiments, the dry etch operation may include applying plasma, such as fluorine-based plasma or fluorine-containing plasma. In some embodiments, each of the first recesses R1 penetrates the first support layer 104, the first material layer 105, the second material layer 106, the second support layer 107, the third material layer 108, and the third support layer 109. The landing areas 102 are exposed through the first recesses R1. In some embodiments, one landing area 102 corresponds to one first recess R1. In some embodiments, positions of the first recesses R1 are defined by one or more lithography operation(s), and a cleaning operation can be performed to remove residues generated in the dry etch operation. In some embodiments, as depicted in FIG. 10', the first recesses R1 may be arranged in a staggered array. A position of each of the first recesses R1 corresponds to a position of one of the landing areas 102.

Each first recess R1 has a first portion P1 laterally surrounded by the first material layer 105, a second portion P2 laterally surrounded by the second material layer 106, a third portion P3 laterally surrounded by the third material layer 108, and a fourth portion P4 laterally surrounded by the first support layer 104. The third portion P3 is above the second portion P2, the second portion P2 is above the first portion P1, and the first portion P1 is above the fourth portion P4.

An etch rate of the dry etch operation in the operation S17 on the first material layer 105 is greater than an etch rate of the dry etch operation on the second material layer 106. Further, the etch rate of the dry etch operation on the second material layer 106 is greater than an etch rate of the dry etch operation on the third material layer 108. Specifically, by doping the first material layer 105 with an N-type dopant in a predetermined concentration, the etch rate of the dry etch operation in the operation S17 on the first material layer 105 in a lateral direction can be enhanced. In contrast, by doping the third material layer 108 with a P-type dopant in a predetermined concentration, the etch rate of the dry etch operation in the operation S17 on the third material layer 108 in a lateral direction can be reduced.

In some embodiments, an aspect ratio of one first recess R1 may be greater than 35. The present disclosure seeks to address an issue of the reduced dimension at the bottom of the recess in the comparative embodiment depicted in FIG. 1. That is, a recess formed by conventional techniques may result in a greater difference between a top dimension and a bottom dimension, which limits device performance. In contrast, a configuration of the first material layer 105, the second material layer 106, and the third material layer 108 can mitigate such issue and improve device performance.

Alternatively stated, by doping the first material layer 105 and the third material layer 108 with different types of dopants, and disposing the second material layer 106 without significant doping between the first material layer 105 and the third material layer 108, profiles of the first recesses R1 can be improved.

Referring to FIG. 10, in some embodiments, a dimension CD1 of the first portion P1 is greater than a dimension CD2 of the second portion P2. In some embodiments, the dimension CD2 of the second portion P2 is greater than a dimension CD3 of the third portion P3. In some embodiments, the dimension CD1 of the first portion P1 is greater than a dimension CD4 of the fourth portion P4. In some embodiments, the dimension CD1 is greater than either the dimension CD2 or the dimension CD3. The aforementioned ranges of dopant concentrations in the material layers are designed to obtain desired values for the dimensions CD1, CD2 and CD3, with a difference between CD1 and CD3 within a predetermined range.

In some alternative embodiments, the dimension CD1 is comparable to the dimension CD2, and the dimension CD2 is comparable to the dimension CD3.

In some embodiments, a top surface 102T of each of the landing areas 102 is exposed through the fourth portion P4 of the first recess R1. A portion of each of the landing areas 102 may be covered by the first support layer 104.

Figure 11:
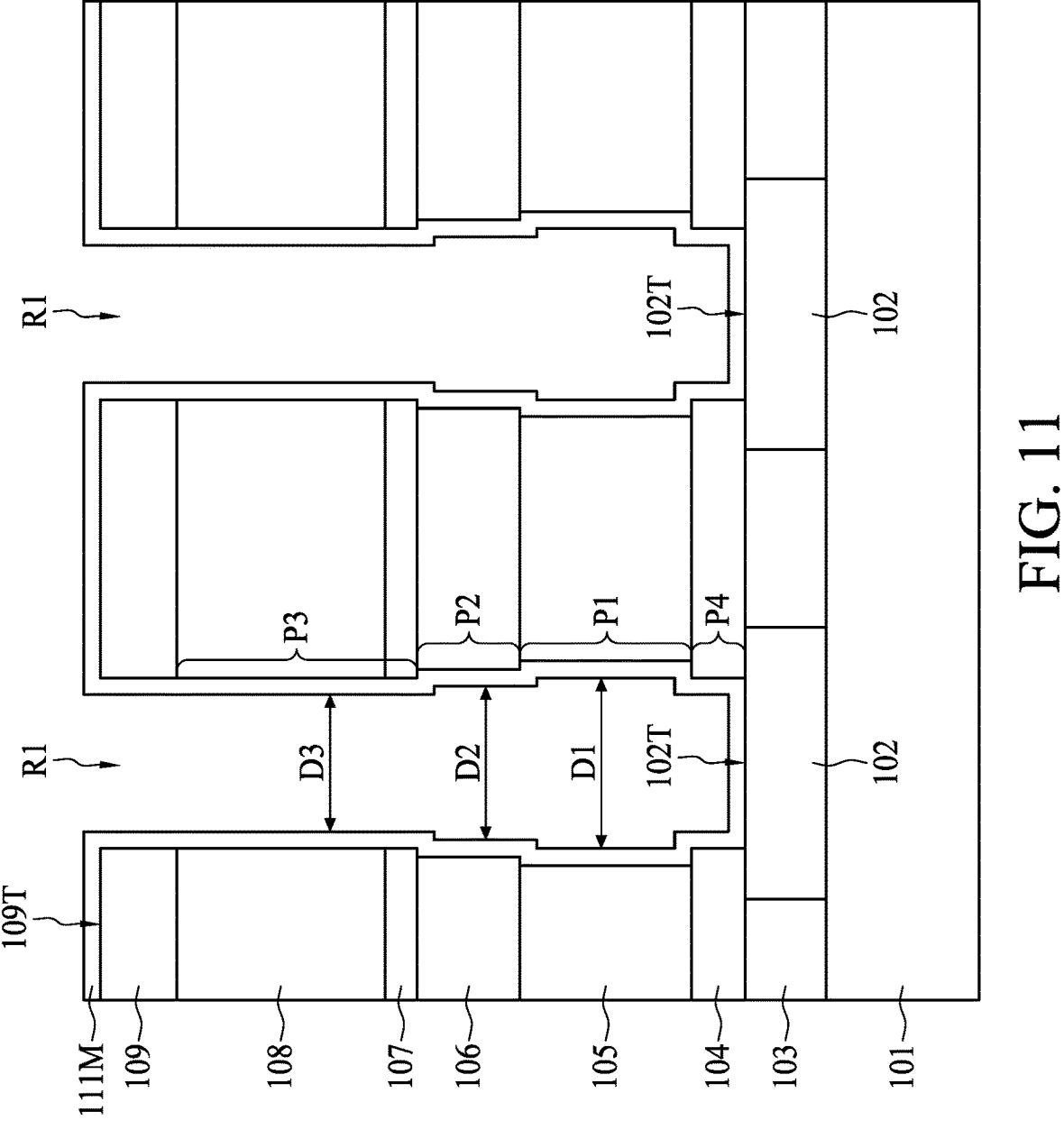
FIGS. 11 to 12 are cross-sectional diagrams of intermediate stages in the formation of a memory device in accordance with some embodiments of the present disclosure.

FIG. 11 is a cross-sectional diagram of an intermediate stage in the formation of a memory device in accordance with some embodiments of the present disclosure. In the operation S18, a bottom electrode material layer 111M is formed in the first recesses R1, thus causing the bottom electrode material layer 111M to have a container-shaped profile. In the present disclosure, the term "container-shaped" or "shaped as a container" may be referred to an object having a bottom and a sidewall portion extended from the bottom, and a portion of a space above the bottom is at least partially surrounded by the sidewall portion in lateral direction. The bottom electrode material layer 111M conforms to a profile of the first recess R1. In some embodiments, the bottom electrode material layer 111M further covers a top surface 109T of the third support layer 109 and the top surface 102T of each of the landing areas 102. In some embodiments, the bottom electrode material layer 111M may include titanium nitride (TiN) and may be formed by blanket deposition, chemical vapor deposition (CVD), physical vapor deposition (PVD), atomic layer deposition (ALD), or the like.

After the forming of the bottom electrode material layer 111M, the first portion P1 of the first recess R1 has a dimension D1, the second portion P2 of the first recess R1 has a dimension D2, and the third portion P3 of the first recess R1 has a dimension D3. In some embodiments, the dimension D3 of the third portion P3 is less than the dimension D2 of the second portion P2. In some embodiments, the dimension D2 of the second portion P2 is less than the dimension D1 of the first portion P1. In some embodiments, the dimension D1 is greater than either the dimension D2 or the dimension D3. In some embodiments, the dimension D3 is in a range from about 26 nm to about 36 nm in certain technology nodes, but the present disclosure is not limited thereto. In some embodiments, a difference between the dimension D3 and the dimension D1 is less than 10 nm, or in some cases, less than 5 nm.

In some alternative embodiments, the dimension D1 is comparable to the dimension D2, and the dimension D2 is comparable to the dimension D3.

In some embodiments, the dimensions D1, D2 and D3 represent a maximum width in a horizontal direction of an empty space of the first portion P1, the second portion P2, and the third portion P3, respectively, of the first recess R1.

Figure 12:
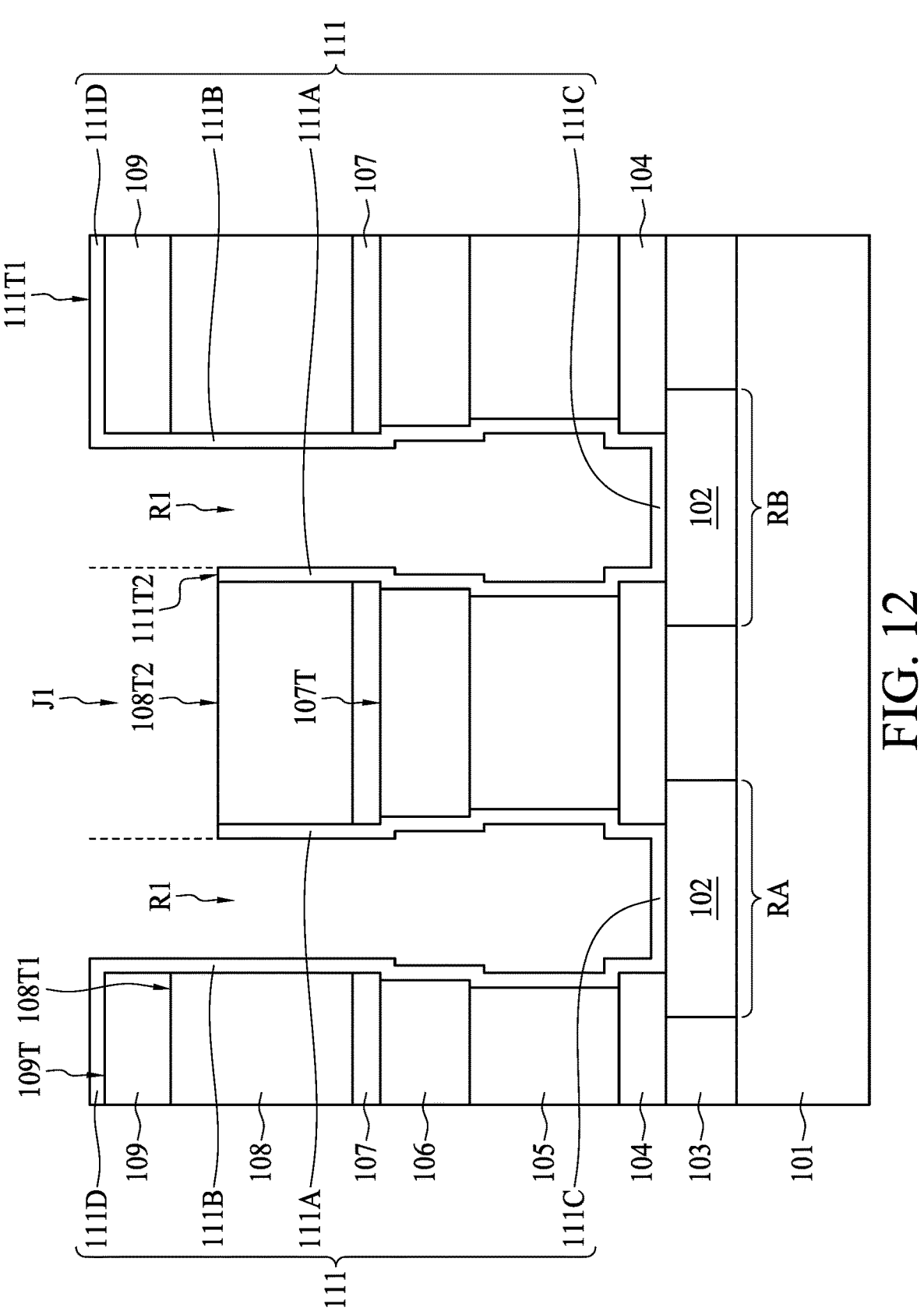
Figure 12:
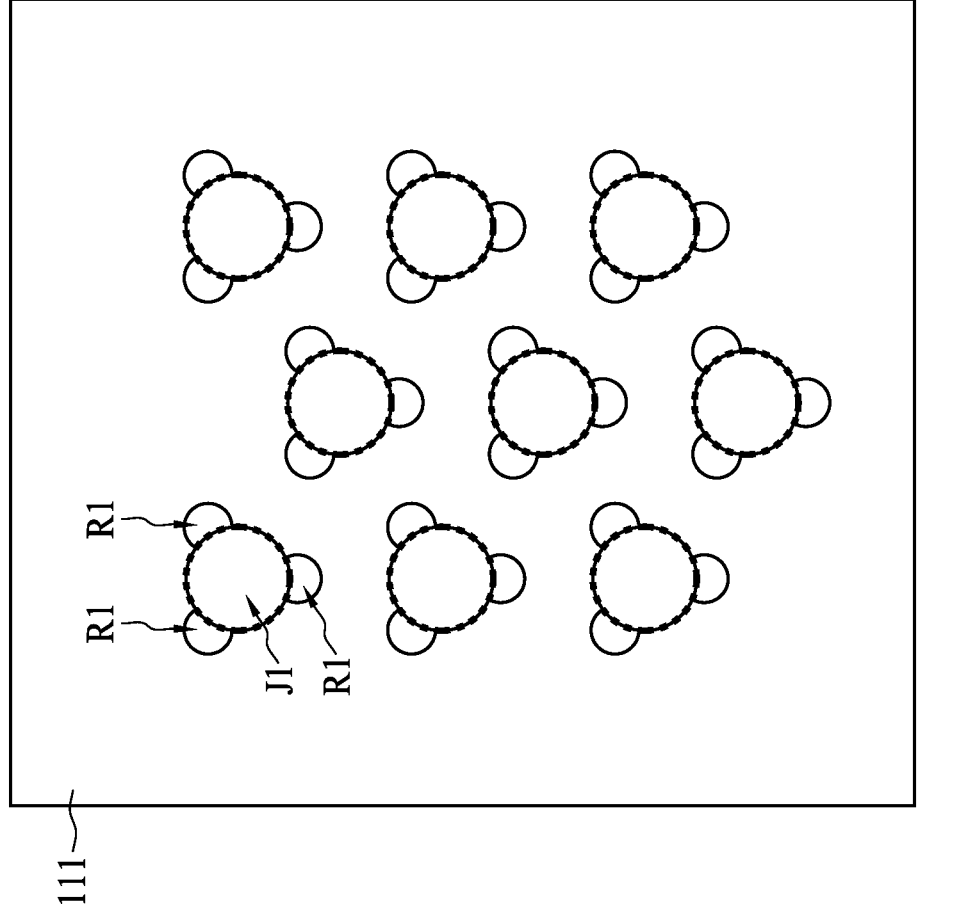

FIG. 12 is a cross-sectional diagram of an intermediate stage in the formation of a memory device in accordance with some embodiments of the present disclosure, and FIG. 12' is a top view perspective schematic diagram of an intermediate stage in the formation of the memory device shown in FIG. 12 in accordance with some embodiments of the present disclosure. After the operation S18, a cutoff region J1 is defined by a lithography operation, wherein the cutoff region J1 connects to at least two first recesses R1. In some embodiments, each cutoff region J1 connects to three first recesses R1, as depicted in FIG. 12'. Further, an etching operation is performed to remove a portion of the third material layer 108, a portion of the third support layer 109, and an upper portion of the bottom electrode material layer 111M (depicted in FIG. 11) over the cutoff region J1. In some embodiments, the etching operation stops at a position in the third material layer 108, or, alternatively stated, the etching operation stops at a position above a top surface 107T of the second support layer 107. After such etching operation, a remaining portion of the third material layer 108 in the cutoff region J1 has a top surface 108T2 lower than the top surface 108T1 of the third material layer 108 that is outside of the cutoff region J1.

The bottom electrode material layer 111M is separated into multiple portions after the etching operation, thereby forming multiple bottom electrodes 111 over each landing area 102. For example, one bottom electrode 111 is formed over the first region RA, and another bottom electrode 111 is formed over the second region RB. Each bottom electrode 111 has a container-shaped profile.

The bottom electrode 111 includes a first wall portion 111A extending upward and adjacent to the cutoff region J1; a second wall portion 111B extending upward and positioned on a side away from the first wall portion 111A; a bottom portion 111C over the landing area 102; and a top portion 111D extending over the third support layer 109.

The first wall portion 111A has a top surface 111T2 lower than the top surface 108T1 of the third material layer 108. The top surface 111T2 is lower than a top surface 111T1 of the top portion 111D of the bottom electrode 111. In some embodiments, the top surface 111T2 is level with the top surface 108T2. A cleaning operation can be performed to remove residues generated during the etching operation.

Figure 13:
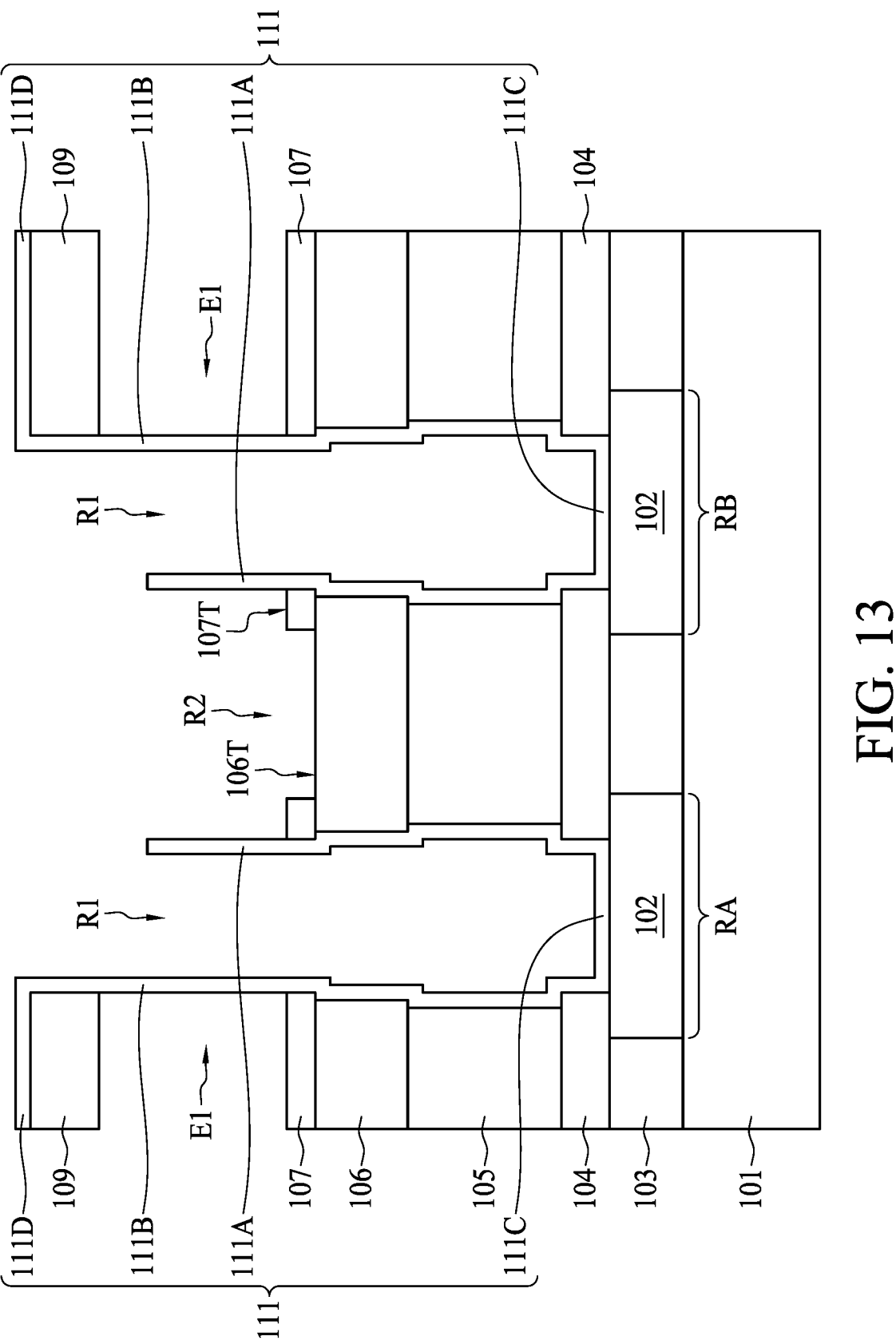
FIGS. 13 to 16 are cross-sectional diagrams of intermediate stages in the formation of a memory device in accordance with some embodiments of the present disclosure.

FIG. 13 is a cross-sectional diagram of an intermediate stage in the formation of a memory device in accordance with some embodiments of the present disclosure. In the operation S19, the third material layer 108 is removed by a removal operation. In some embodiments, the removal operation includes applying $NF_3$ and $H_2$, along with an application of plasma, over the third material layer 108. The removal operation has an etch rate on Si significantly greater than an etch rate on SiN; for example, around 2000:1. Further, when the targeted layer to be etched is partially covered by SiN, the aforesaid etching recipe is an effective operation. After the removal operation is performed, the third support layer 109 remains adhered to the bottom electrode 111 and overhangs the second support layer 107. In some embodiments, the third support layer 109 is attached to the second wall portion 111B and the top portion 111D of the bottom electrode 111.

The top surface 107T of the second support layer 107 is exposed, and an empty space E1 is formed between the second support layer 107 and the third support layer 109.

After the removal operation, a punch-through operation is performed to remove a portion of the second support layer 107 in the cutoff region J1. Therefore, a second recess R2 is formed in the second support layer 107, and a top surface 106T of the second material layer 106 is exposed through the second recess R2. The second recess R2 is positioned between the first wall portions 111A of a plurality of the bottom electrodes 111.

Figure 14:
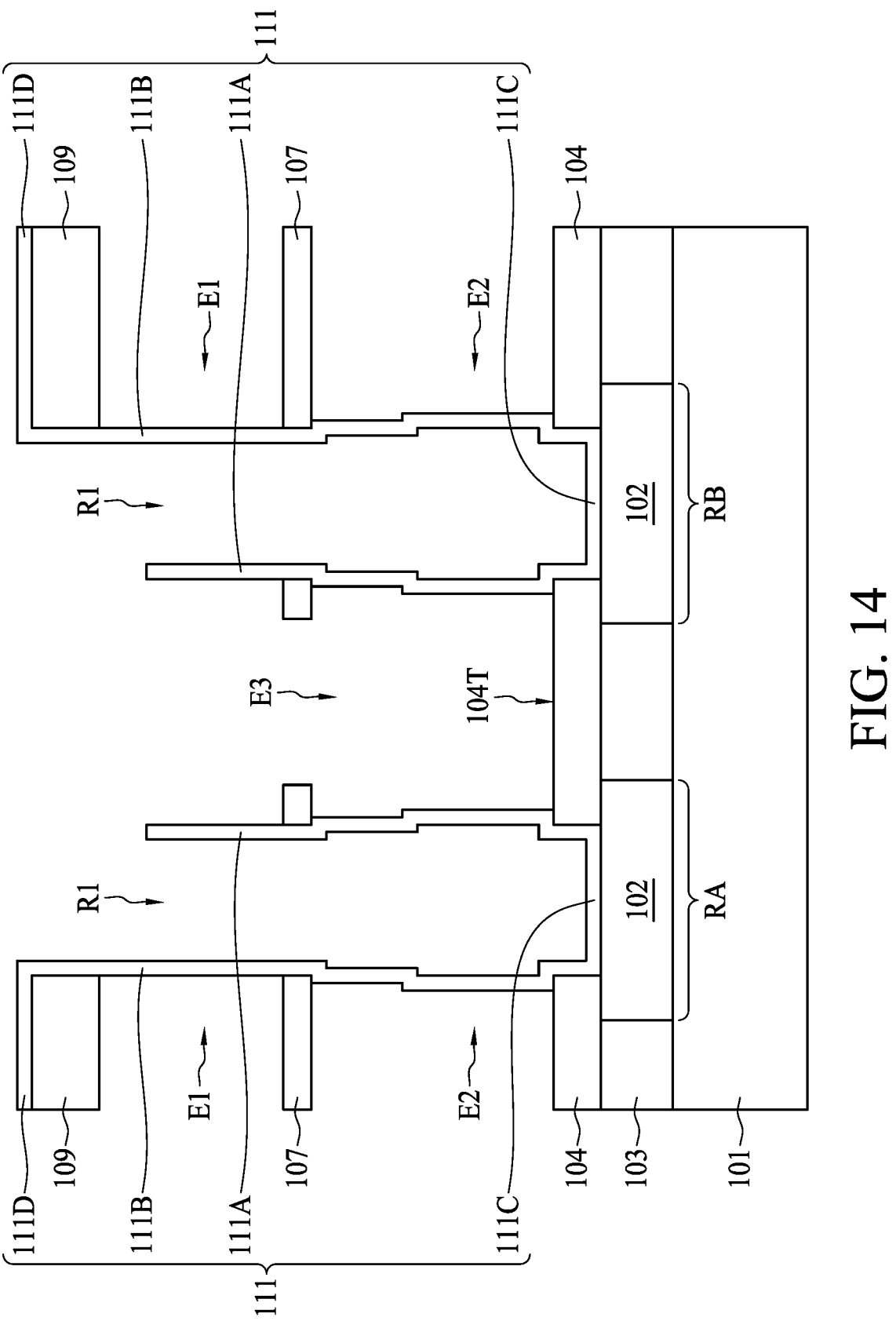

FIG. 14 is a cross-sectional diagram of an intermediate stage in the formation of a memory device in accordance with some embodiments of the present disclosure. In the operation S19, the first material layer 105 and the second material layer 106 are removed by a removal operation. In some embodiments, the removal operation includes applying $NF_3$ and $H_2$, along with an application of plasma, over the first material layer 105 and the second material layer 106. Such removal operation has an etch rate on Si significantly greater than an etch rate on SiN, for example, around 2000:1. After performing the removal operation, the second support layer 107 remains adhered to the bottom electrode 111 and overhangs the first support layer 104. In some embodiments, the etching chemical enters through the second recess R2 depicted in FIG. 13. In some embodiments, the second support layer 107 is attached to the second wall portion 111B of the bottom electrode 111. The top surface 104T of the first support layer 104 is exposed. An empty space E2 is formed between the first support layer 104 and the second support layer 107. An empty space E3 is formed between the first wall portions 111A of the plurality of bottom electrodes 111.

In summary, in the operation S19, a portion of the bottom electrode material layer 111M is removed to form the bottom electrode 111, and the first material layer 105, the second material layer 106, and the third material layer 108 are removed. The first support layer 104, the second support layer 107, the third support layer 109, and the bottom electrodes 111 remain in place.

Figure 15:
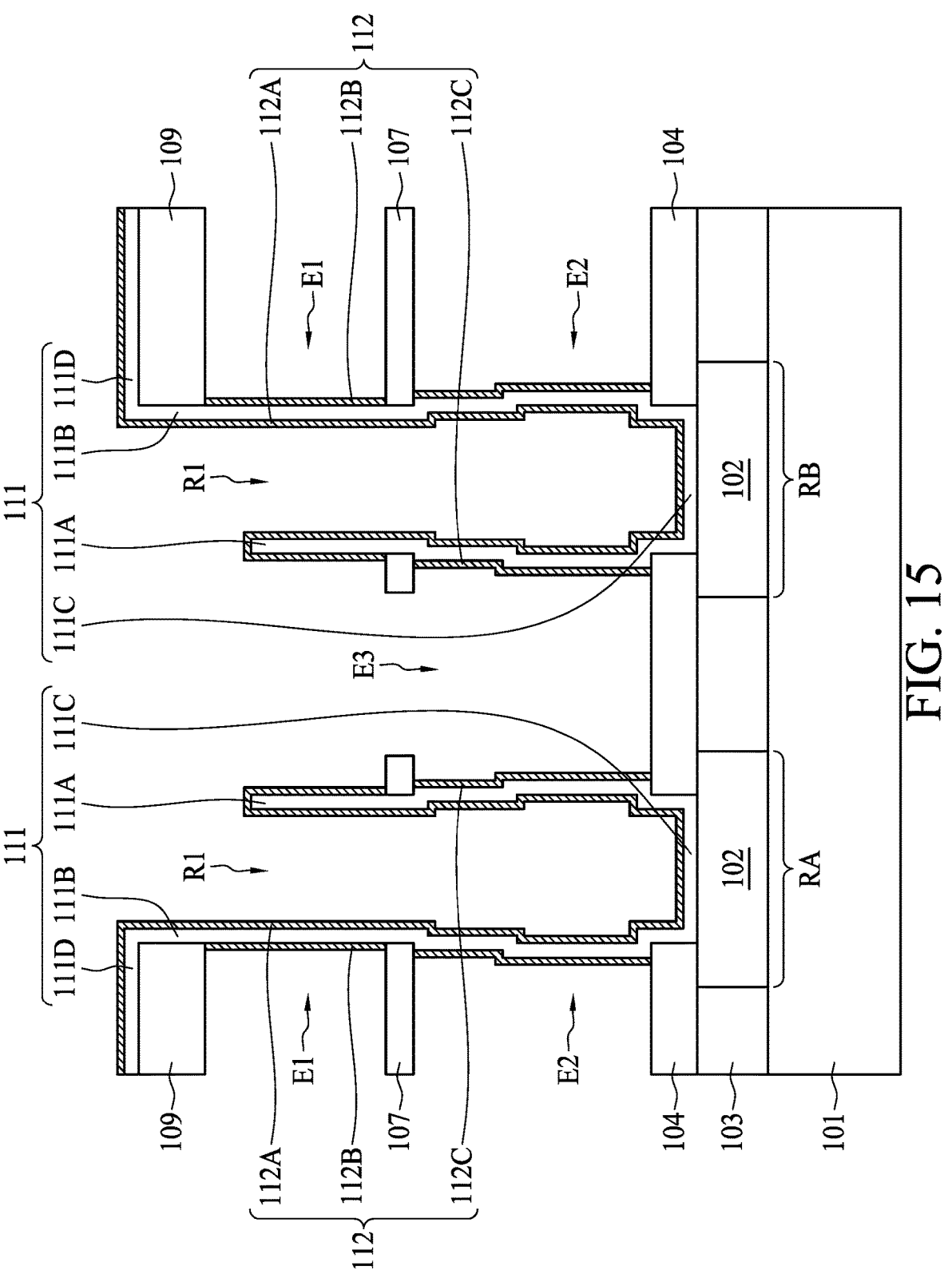

FIG. 15 is a cross-sectional diagram of an intermediate stage in the formation of a memory device in accordance with some embodiments of the present disclosure. In the operation S20, a high-k layer 112 is formed over an exposed area of the bottom electrodes 111. The high-k layer 112 includes a first part 112A on a side of the bottom electrode 111 proximal to the first recess R1, a second part 112B on an opposite side of the second wall portion 111B (which is proximal to the empty space E1 and the empty space E2), and a third part 112C proximal to the empty space E3. In some embodiments, the high-k layer 112 is formed by an atomic layer deposition operation.

Figure 16:
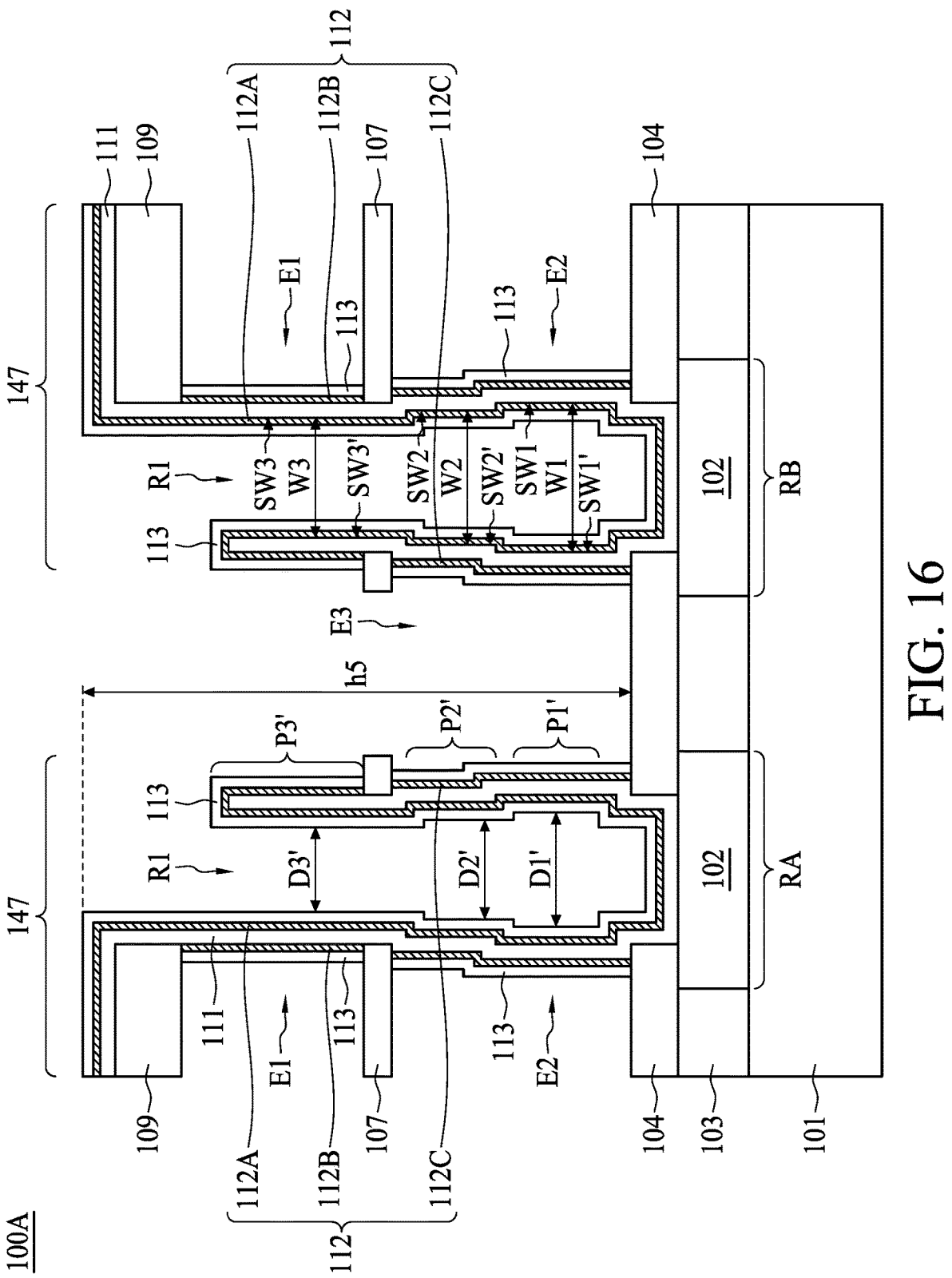

FIG. 16 is a cross-sectional diagram of an intermediate stage in the formation of a memory device in accordance with some embodiments of the present disclosure. In the operation S21, a top electrode 113 is formed over the high-k layer 112, thereby forming a memory device 100A. In the operation S21, the top electrode 113 may include TiN, and can be formed by an atomic layer deposition operation.

One set of the top electrode 113, the bottom electrode 111, and the high-k layer 112 is collectively referred to as a container structure 147. The container structure 147 can also be referred to as a double side container, wherein the top electrode 113 is formed over two sides of one bottom electrode 111.

One container structure 147 has a lower portion P1', a middle portion P2' above the lower portion P1', and an upper portion P3' above the middle portion P2'. The first recess R1 defined by one container structure 147 has a dimension D1' at a level of the lower portion P1', a dimension D2' at a level of the middle portion P2', and a dimension D3' at a level of the upper portion P3'. In some embodiments, the dimension D1' is greater than the dimension D2'. In some embodiments, the dimension D2' is greater than the dimension D3'. In some embodiments, the dimension D1' is greater than either the dimension D2' or the dimension D3'. The dimensions D1', D2' and D3' are maximum widths in a lateral direction of a corresponding empty space of the first recess R1.

In some alternative embodiments, the dimension D1' is comparable to the dimension D2', and the dimension D2' is comparable to the dimension D3'.

Further, the lower portion P1' has a first width W1 measured from a first inner sidewall SW1 of the bottom electrode 111 to a second inner sidewall SW1' of the bottom electrode 111, the middle portion P2' has a second width W2 measured from a third inner sidewall SW2 of the bottom electrode 111 to a fourth inner sidewall SW2' of the bottom electrode 111, and the upper portion P3' has a third width W3 measured from a fifth inner sidewall SW3 of the bottom electrode 111 to a sixth inner sidewall SW3' of the bottom electrode 111.

In some embodiments, the first width W1 is greater than the second width W2. In some embodiments, the second width W2 is greater than the third width W3. In some embodiments, the first width W1 is greater than either the second width W2 or the third width W3.

In some alternative embodiments, the third width W3 is comparable to the second width W2, and the second width W2 is comparable to the first width W1.

In some embodiments, a total thickness h5 of the container structure 147 may be in a range from 0.8 μm to about 1.2 μm. The first recess R1 is laterally surrounded by the top electrode 113 and the bottom electrode 111.

Optionally, another insulation layer can be formed over the top electrode 113, but the present disclosure is not limited thereto.

As previously discussed, the container structure 147 has a profile that has a relatively wider bottom width (compared to a profile of the comparative embodiment depicted in FIG. 1); thus, it has a greater capacitance, which improves a device performance of the memory device 100A.

FIG. 17 is a flow diagram illustrating a method of manufacturing a memory device in accordance with some embodiments of the present disclosure. The method S2 includes a number of operations (S11, S12, S13, S14, S15, S16, S17, S18', S19', and S20') and the description and illustration are not deemed as a limitation to the sequence of the operations. In the operation S11, a first support layer is formed over a substrate. In the operation S12, a first material layer is formed over the first support layer, wherein the first material layer is doped with an N-type dopant. In the operation S13, a second material layer is formed over the first material layer. In the operation S14, a second support layer is formed over the second material layer. In the operation S15, a third material layer is formed over the second support layer, wherein the third material layer is doped with a P-type dopant. In the operation S16, a third support layer is formed over the third material layer. In the operation S17, a dry etch operation is performed to form a first recess, wherein the first recess penetrates the first material layer, the second material layer, and the third material layer. In the operation S18', a bottom electrode material layer is formed in the first recess. In the operation S19', a high-k layer and a top electrode material layer are formed in the first recess. In the operation S20', a planarization operation is performed over the top electrode material layer to form a top electrode in the first recess.

FIGS. 1 to 10 and 18 to 20 are schematic diagrams illustrating various fabrication stages constructed according to the method S2 in accordance with some embodiments of the present disclosure.

Figure 18:
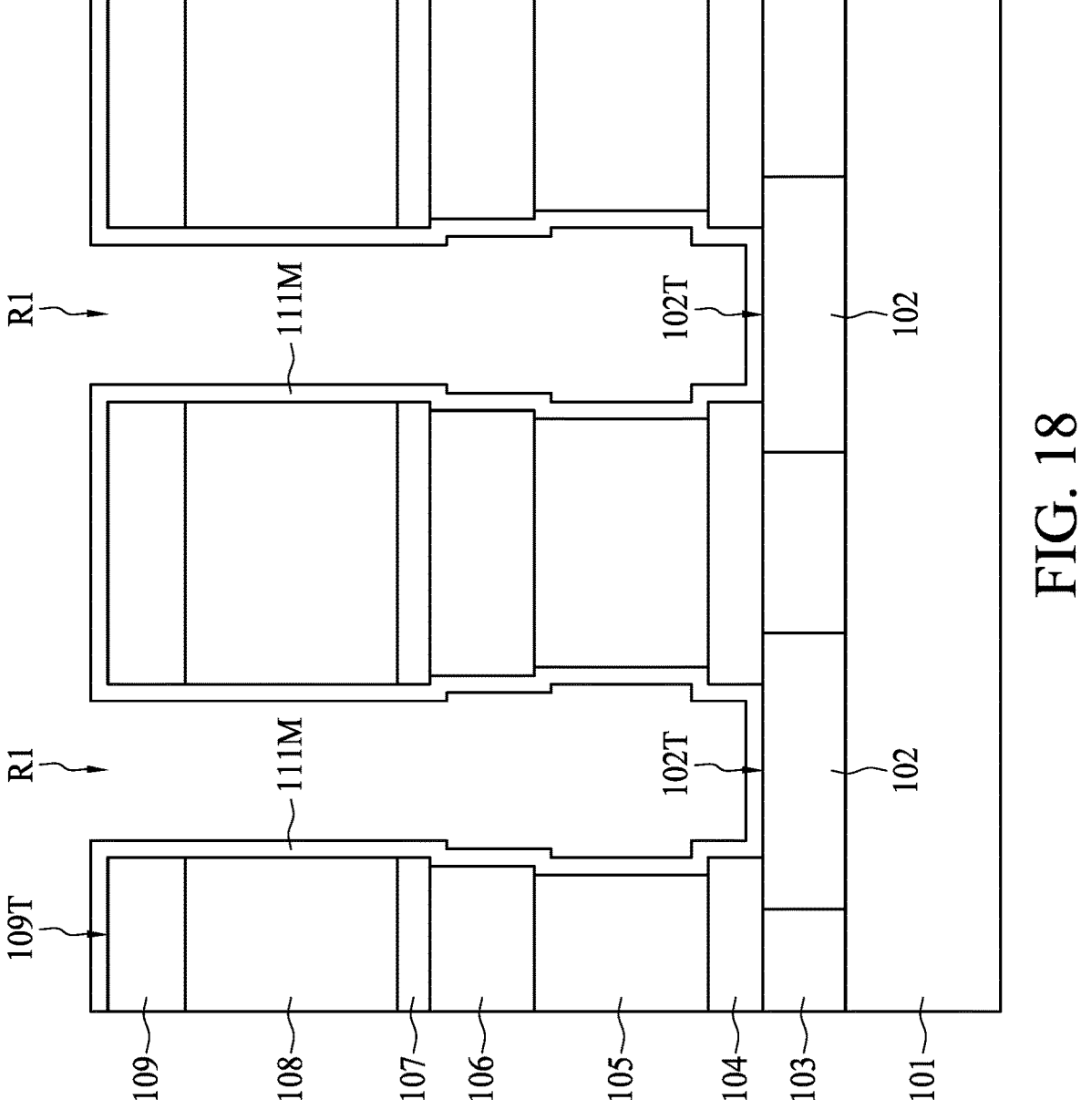
FIGS. 18 to 20 are cross-sectional diagrams of intermediate stages in the formation of a memory device in accordance with some embodiments of the present disclosure.
Figure 19:
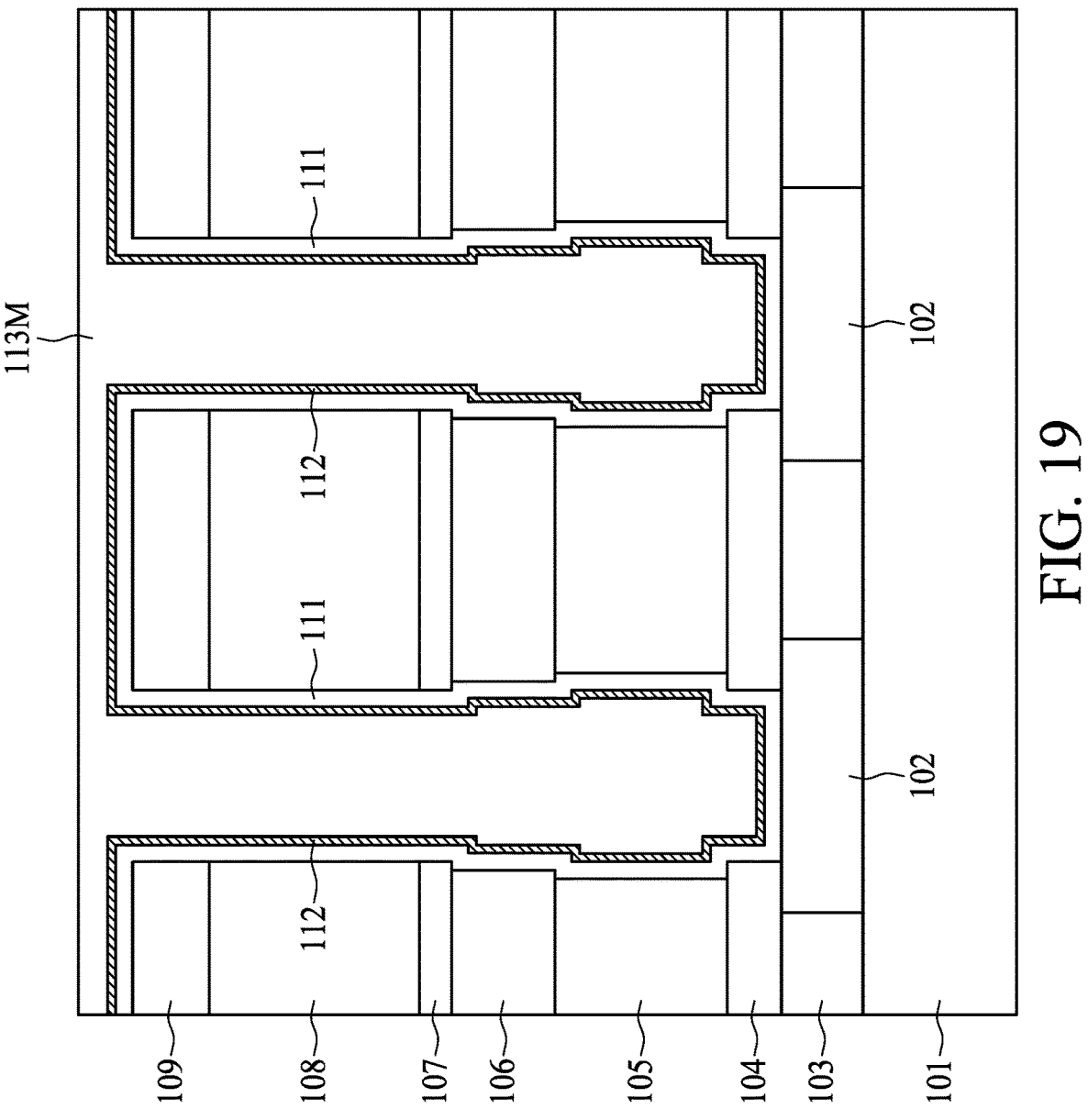
Figure 20:
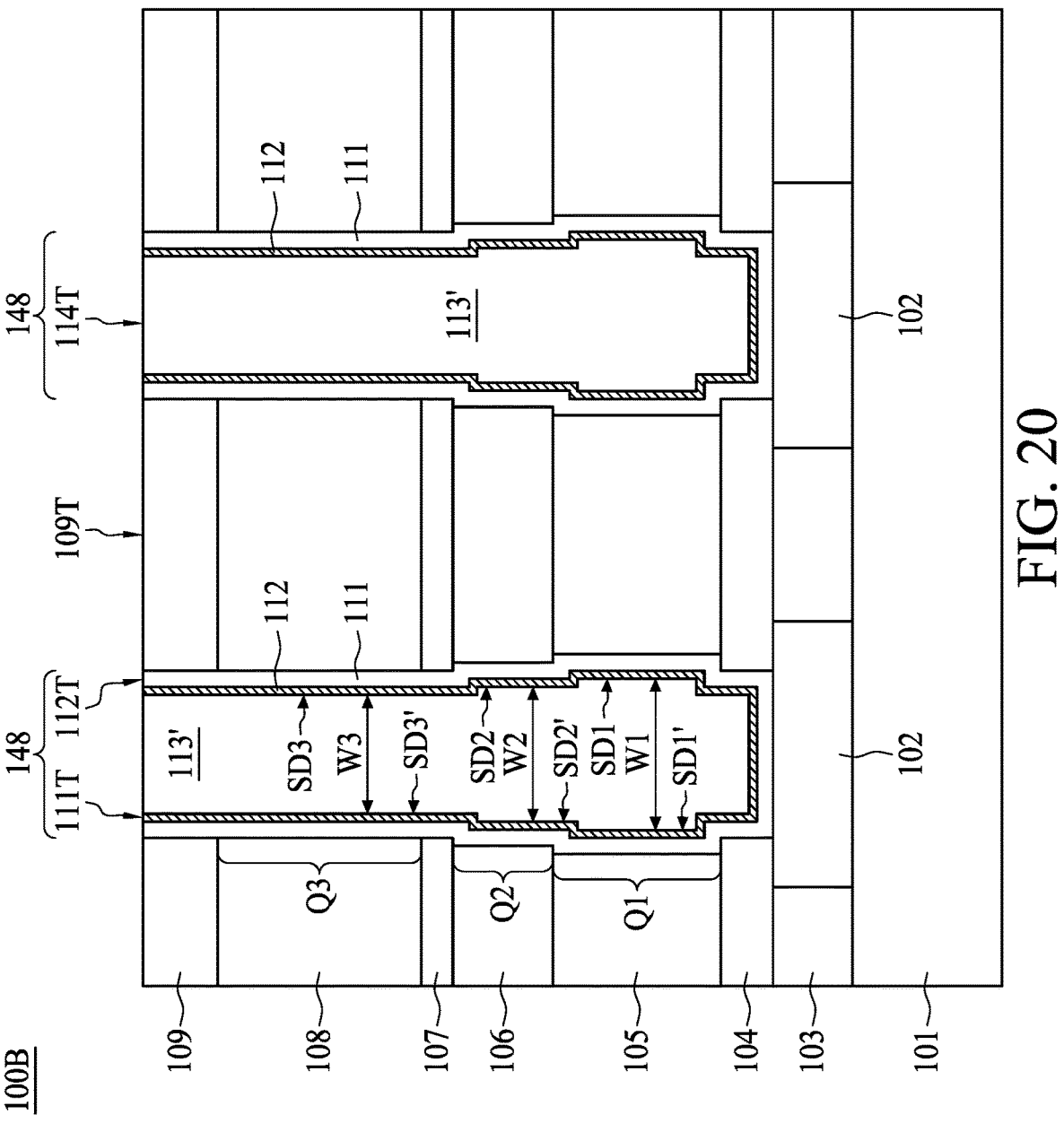

After performing operations S11 to S17 as depicted in FIGS. 1 to 10, operations S18' to S20' are performed, as will be depicted in FIGS. 18 to 20.

FIG. 18 is a cross-sectional diagram of an intermediate stage in the formation of a memory device in accordance with some embodiments of the present disclosure. The operation S18' is performed after performing the operation S17 as depicted in FIG. 10, wherein in the operation S18', a bottom electrode material layer 111M is formed in the first recess R1. In some embodiments, the bottom electrode material layer 111M covers a top surface 109T of the third support layer 109 and the top surface 102T of each of the landing areas 102. In some embodiments, the bottom electrode material layer 111M may include titanium nitride (TiN) and may be formed by blanket deposition, chemical vapor deposition (CVD), physical vapor deposition (PVD), atomic layer deposition (ALD), or the like. The bottom electrode material layer 111M conforms to a profile of the first recess R1.

FIG. 19 is a cross-sectional diagram of an intermediate stage in the formation of a memory device in accordance with some embodiments of the present disclosure. In the operation S19', a high-k layer 112 is formed over the bottom electrode material layer 111M in the first recess R1 (which is depicted in FIG. 18). In some embodiments, the high-k layer 112 is formed by an atomic layer deposition operation (ALD), chemical vapor deposition (CVD), physical vapor deposition (PVD), selective deposition, or the like.

Further, in the operation S19', a top electrode material layer 113M is formed in the first recess R1 (which is depicted in FIG. 18). The top electrode material layer 113M may include TiN, and can be formed by a plating operation or another type of deposition operation. In some embodiments, a portion of the top electrode material layer 113M is above the third support layer 109 and is above a portion of the bottom electrode material layer 111M that is above the third support layer 109.

FIG. 20 is a cross-sectional diagram of an intermediate stage in the formation of a memory device in accordance with some embodiments of the present disclosure. In the operation S20', a planarization operation, such as a chemical mechanical planarization (CMP) operation, is performed to remove an excessive portion of the top electrode material layer 113M and the bottom electrode material layer 111M, thereby forming the top electrode 113' and the bottom electrode 111 in the first recess R1 (which is depicted in FIG. 18). The planarization operation may stop at the third support layer 109, and the high-k layer 112 separates the bottom electrode 111 from the top electrode 113', thereby forming a memory device 100B including a plurality of capacitance structures 148 over the landing areas 102.

The top electrode 113' of the capacitance structures 148 has a lower portion Q1 laterally surrounded by the first material layer 105, a middle portion Q2 laterally surrounded by the second material layer 106, and an upper portion Q3 laterally surrounded by the third material layer 108. The lower portion Q1 has a first width W1 measured from a first inner sidewall SD1 of the top electrode 113' to a second inner sidewall SD1' of the top electrode 113', the middle portion Q2 has a second width W2 measured from a third inner sidewall SD2 of the top electrode 113' to a fourth inner sidewall SD2' of the top electrode 113', and the upper portion Q3 has a third width W3 measured from a fifth inner sidewall SD3 of the top electrode 113' to a sixth inner sidewall SD3' of the top electrode 113'.

In some embodiments, the first width W1 is greater than the second width W2. In some embodiments, the second width W2 is greater than the third width W3. In some embodiments, the first width W1 is greater than either the second width W2 or the third width W3.

In some alternative embodiments, the third width W3 is comparable to the second width W2, and the second width W2 is comparable to the first width W1.

One aspect of the present disclosure provides a memory device including: a substrate, a landing area over the substrate, a bottom electrode over the landing area, and a high-k layer over the bottom electrode, wherein the bottom electrode includes a lower portion over the landing area, wherein the lower portion has a first width measured from a first inner sidewall of the lower portion to a second inner sidewall of the lower portion, a middle portion over the lower portion, wherein the middle portion has a second width measured from a third inner sidewall of the middle portion to a fourth inner sidewall of the middle portion, and an upper portion over the middle portion, wherein the upper portion has a third width measured from a fifth inner sidewall of the upper portion to a sixth inner sidewall of the upper portion, wherein the third width is greater than the first width.

Another aspect of the present disclosure provides a memory device including: a substrate; a landing area over the substrate; a bottom electrode over the landing area, wherein the bottom electrode has a container-shaped profile and the bottom electrode includes a lower portion over the landing area and an upper portion over the lower portion; a high-k layer over the bottom electrode; a first support layer over the substrate; and a second support layer over the first support layer, wherein the second support layer is separated from the first support layer.

Another aspect of the present disclosure provides a method for fabricating a memory device including: forming a first support layer over a substrate; forming a first material layer over the first support layer, wherein the first material layer is doped with an N-type dopant; forming a second material layer over the first material layer; forming a second support layer over the second material layer; forming a third material layer over the second support layer, wherein the third material layer is doped with a P-type dopant; performing a dry etch operation to form a first recess, wherein the first recess penetrates the first material layer, the second material layer, and the third material layer; and forming a bottom electrode in the first recess.

In conclusion, a bottom electrode of a memory structure can be formed by depositing a bottom electrode in a recess, such that the bottom electrode has a container-shaped profile and has a sidewall conforming to a profile of the recess. However, in comparative embodiments, a recess formed by conventional operations may have a bottom dimension significantly less than a top dimension (for example, such difference is 10 nm to about 15 nm in some technology nodes). Accordingly, a capacitor, including a bottom electrode and a top electrode, formed in such recess has less capacitance and mediocre device performance. In other comparative embodiments, it is difficult to control a wet etch operation for forming a recess configured to at least temporarily accommodate an electrode, wherein a uniformity of profiles of electrodes formed in multiple recesses may be less than desired, which leads to poor device performance, and can even cause electrical shorting between electrodes.

Therefore, the present disclosure provides a memory device and a method for fabricating the memory device for addressing the issues described above. The method for fabricating the memory device 100A is depicted in FIGS. 2 to 16, and the method for fabricating the memory device 100B is depicted in FIG. 17 as well as FIGS. 3 to 10 and 18 to 20. The memory device 100A depicted in FIG. 16 and the memory device 100B depicted in FIG. 20 may be utilized in different application based on specific requirements.

As depicted in FIG. 10, by using a dry etch operation, which may include applying plasma, such as fluorine-based plasma, a first recess R1 with a desired profile can be formed in a stack including a first material layer 105, a second material layer 106, and a third material layer 108. Specifically, by doping the first material layer 105 with an N-type dopant in a predetermined concentration, an etch rate of the dry etch operation on the first material layer 105 can be enhanced. In contrast, by doping the third material layer 108 with a P-type dopant in a predetermined concentration, an etch rate of the dry etch operation on the third material layer 108 can be reduced. As a result, a dimension of the first recess R1 can be increased and it is easier to determine a timing of a termination of the plasma operation due to a configuration of the stack with a specifically designed dopant distribution having layers with different conductivity properties. The dopant concentration ranges discussed in the present disclosure are based on a selected means for performing a corresponding etching operation. Therefore, the bottom electrode formed therein has a better profile.

Further, in the method for forming the memory device 100A, the first recesses R1 and the cutoff region J1 are defined in a way to increase device density while being able to allow suitable a selective etching chemical to remove the first material layer 105, the second material layer 106, and the third material layer 108 efficiently.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods and steps.

What is claimed is:

1. A memory device, comprising:
   a substrate;
   a landing area over the substrate;
   a bottom electrode over the landing area, wherein the bottom electrode comprises:
      a lower portion over the landing area, wherein the lower portion has a first width measured from a first inner sidewall of the lower portion to a second inner sidewall of the lower portion;
      a middle portion over the lower portion, wherein the middle portion has a second width measured from a third inner sidewall of the middle portion to a fourth inner sidewall of the middle portion;
      an upper portion over the middle portion, wherein the upper portion has a third width measured from a fifth inner sidewall of the upper portion to a sixth inner sidewall of the upper portion, wherein the first width is greater than the third width; and
      a bottom portion formed between the lower portion and the landing area, wherein the bottom portion has a fourth width different from the second width; and
   a high-k layer over the bottom electrode.

2. The memory device of claim 1, wherein the first width is greater than the second width, wherein the first width is greater than the fourth width.

3. The memory device of claim 1, further comprising a top electrode over the high-k layer, wherein the top electrode is separated from the bottom electrode.

4. The memory device of claim 1, wherein a first recess is laterally surrounded by the bottom electrode.

5. The memory device of claim 1, further comprising a first support layer proximal to the landing area.

6. The memory device of claim 5, wherein the first support layer is made of SiN.

7. The memory device of claim 5, wherein the first support layer is in direct contact with the bottom portion of the bottom electrode.

8. The memory device of claim 5, further comprising a second support layer over the first support layer.

9. The memory device of claim 8, wherein the second support layer is separated from the first support layer.

10. The memory device of claim 8, wherein an empty space is between the second support layer and the first support layer, wherein the first portion and the second portion of the bottom electrode are defined between the second support layer and the first support layer.

11. The memory device of claim 8, wherein the second support layer is in direct contact with the upper portion of the bottom electrode.

12. The memory device of claim 8, further comprising a third support layer over the second support layer, wherein the third support layer is in direct contact with the upper portion of the bottom electrode, and the third support layer comprises SiN.

*    *    *    *    *